United States Patent
Graham et al.

(10) Patent No.: US 6,678,321 B1
(45) Date of Patent: Jan. 13, 2004

(54) METHOD AND APPARATUS FOR TRANSMITTING AND RECEIVING A SYMBOL OVER POTS WIRING USING A MULTI-CYCLE WAVEFORM

(75) Inventors: Martin H. Graham, Berkeley, CA (US); Harold H. Webber, Jr., Lafayette, CA (US); Matthew Taylor, Pleasant Hill, CA (US)

(73) Assignee: Tut Systems, Inc., Pleasant Hill, CA (US)

( * ) Notice: Subject to any disclaimer, the term of this patent is extended or adjusted under 35 U.S.C. 154(b) by 0 days.

(21) Appl. No.: 09/153,812

(22) Filed: Sep. 15, 1998

(51) Int. Cl.[7] .................................................. H03K 7/08
(52) U.S. Cl. ........................................ 375/238; 375/369
(58) Field of Search ................................. 375/368, 369, 375/239, 238, 257, 259, 370; 370/445, 473, 968, 910, 267, 908; 332/109, 112; 340/870.19

(56) References Cited

U.S. PATENT DOCUMENTS

| | | | |
|---|---|---|---|
| 4,706,246 A | 11/1987 | Kume | 370/445 |
| 4,785,396 A | 11/1988 | Murphy et al. | |
| 4,817,115 A | 3/1989 | Campo et al. | 375/238 |
| 5,151,698 A | 9/1992 | Pophillat | 341/52 |
| 5,162,791 A | 11/1992 | Heegard | |
| 5,339,307 A | 8/1994 | Curtis | |
| 5,450,594 A | 9/1995 | Aden et al. | 709/225 |
| 5,515,035 A | 5/1996 | Gut | 340/825.5 |
| 5,548,614 A | 8/1996 | Stoll et al. | 375/211 |
| 5,587,692 A | 12/1996 | Graham et al. | 333/12 |
| 5,614,901 A | 3/1997 | Haas | 341/68 |
| 5,657,326 A | 8/1997 | Burns et al. | |
| 5,696,790 A | 12/1997 | Graham et al. | 375/238 |
| 5,790,495 A | 8/1998 | Kimura et al. | |
| 5,856,980 A | 1/1999 | Doyle | |
| 5,930,303 A | 7/1999 | Walker | |
| 5,963,539 A | 10/1999 | Webber, Jr. et al. | |
| 5,982,741 A | 11/1999 | Ethier | |
| 6,064,697 A | 5/2000 | Yoshikawa | |
| 6,075,795 A | 6/2000 | Barsoum et al. | |
| 6,157,616 A | 12/2000 | Whitehead | |
| 6,381,213 B1 | 4/2002 | Webber, Jr. et al. | |

*Primary Examiner*—Chi Pham
*Assistant Examiner*—Dung X. Nguyen
(74) *Attorney, Agent, or Firm*—Blakely, Sokoloff, Taylor & Zafman LLP

(57) ABSTRACT

A method of transmitting information over POTS wiring includes transmitting a first delimiter signal, in the form of a multi-cycle waveform having a frequency of approximately 7.5 MHz, over the POTS wiring. A second delimiter signal, also comprising a multi-cycle waveform, is then later propagated over the POTS wiring. The time duration between the respective propagations of the first and second delimiter signals defines a symbol, which encodes information. The time duration is also such that reflections on the carrier medium resulting from the propagation of the first delimiter signal decay to a predetermined level prior to propagation of the second delimiter signal.

22 Claims, 24 Drawing Sheets

METHOD AND APPARATUS FOR TRANSMITTING AND RECEIVING A SYMBOL OVER POTS WIRING USING A MULTI-CYCLE WAVEFORM

FIELD OF THE INVENTION

The present invention relates generally to the field of encoding and decoding digital data for transmission over a medium. More specifically, the present invention relates to the transmission and reception of a symbol over Plain Old Telephone Service (POTS) wiring.

BACKGROUND

Local Area Network (LAN) standards and products have not significantly penetrated the home computing market for a number of reasons, including the lack of perceived need and the required installation of special cabling, which is difficult within a residential household. As multiple personal computers (PCs) are becoming increasingly common within households, the notion of implementing a LAN within a residential environment is gaining in popularity. Specifically, the ability to share information between multiple PCs, and to share resources such as printers and modems, is becoming increasingly attractive to home computer users. In particular, the ability to achieve shared, high-speed Internet access by a number of computers within a household is becoming important as multiple users within a residence may wish simultaneously to access the Internet.

One economical method of creating a LAN within a residential household proposes using the existing telephone wiring within the residence (POTS wiring) as the medium over which the LAN is implemented. Such wiring typically comprises unshielded, twisted-pair (UTP) telephone cable and may comprise either Category 1 or Category 2 cable, as defined by the EIA/TIA 568 specification. The use of such residential telephone wiring poses a number of problems in that the transmission of data signals must occur over an arbitrary, unterminated wiring system, with unknown electrical characteristics. This results in impedance mismatches and the lack of termination contributes to the persistent reflection of signals and unpredictable peaks and valleys in frequency response within a band of interest. The power splitting effect of star configurations, which are commonly implemented in residential wiring, attenuates the levels of signal features whose duration is short compared to the propagation delay of the wire branches.

A LAN implemented over residential telephone wiring must also coexist with the POTS service, and must be FCC part 68 compliant, which dictates the use of signals with no frequency components below 270 kHz and transport levels below 178 mV.

SUMMARY OF THE INVENTION

According to a first aspect of the invention, there is provided a method of transmitting information over a carrier medium within a computer network. A first delimiter signal is propagated over the carrier medium at a first time. A second delimiter signal is propagated over the carrier medium at a second time. The time duration between the propagation of the first and second delimiter signal encodes information. The first and second delimiter signals furthermore each comprise a multi-cycle waveform having a frequency of greater than 1.1 MHz.

According to a second aspect of the invention, there is provided a method of receiving information transmitted over a carrier medium. Detection of a signal on the carrier medium is disabled for a predetermined time in response to the detection of a first delimiter signal propagated on the carrier medium. A second delimiter signal is then detected after the expiration of the predetermined time. The time duration between the detection of the first and second delimiter signals encodes information and the step of detecting the second delimiter signal comprises detecting a multi-cycle waveform having a frequency of greater than 1.1 MHz.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and apparatus for transmitting and receiving a symbol over POTS wiring are described. In the following description, for the purposes of explanation, numerous specific details are set forth in order to provide a thorough understanding of the present invention. It will be evident, however, to one skilled in the art that the present invention may be practiced without these specific details.

For the purposes of this specification the term "delimiter" shall be taken to refer to any signal, marking or character that marks either the beginning or end of a unit of data.

Apparatus—Overview

Figure 1A:
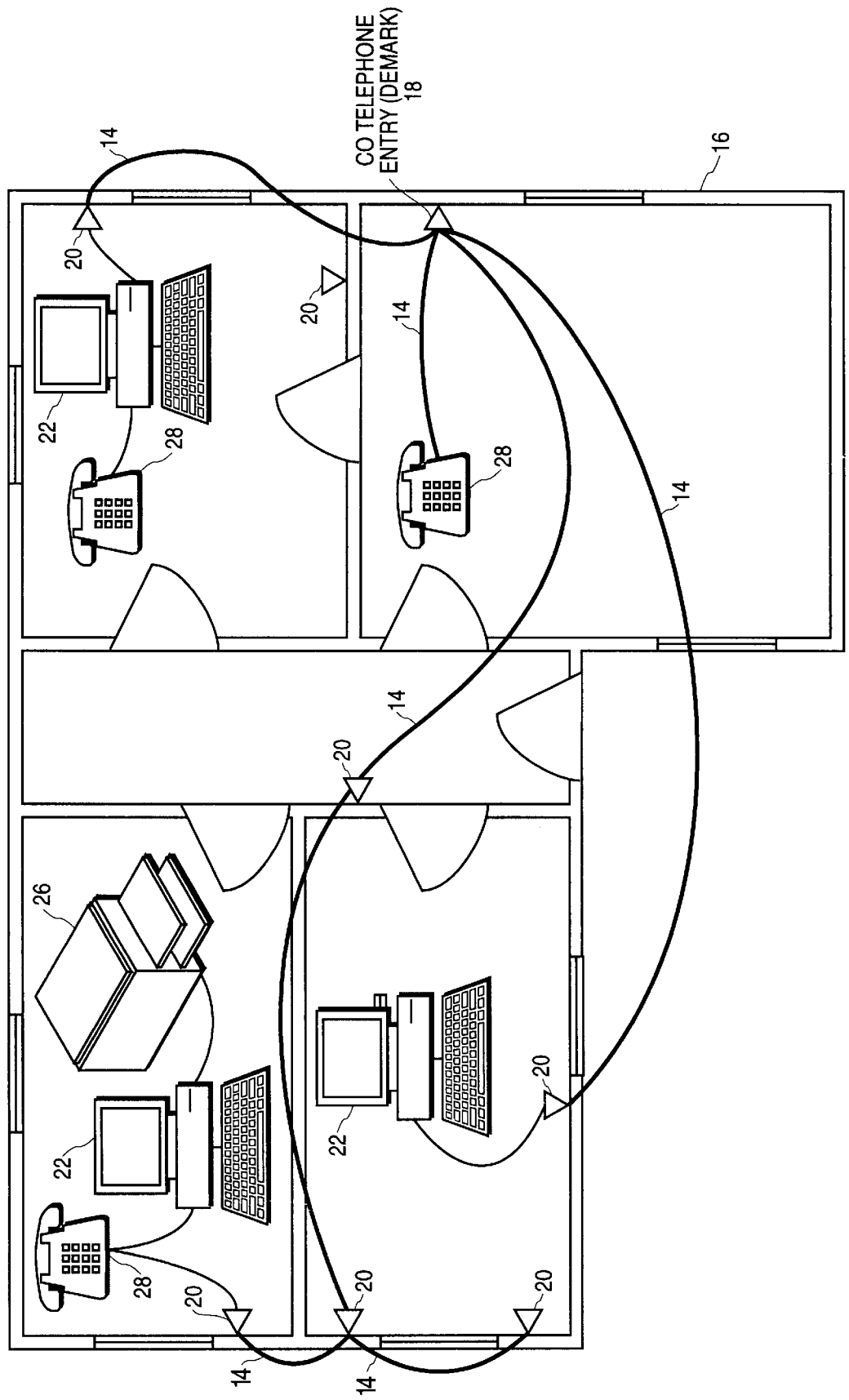
FIGS. 1a and 1b illustrate Local Area Networks (LANs) implemented using arbitrary POTS wiring.
Figure 1B:
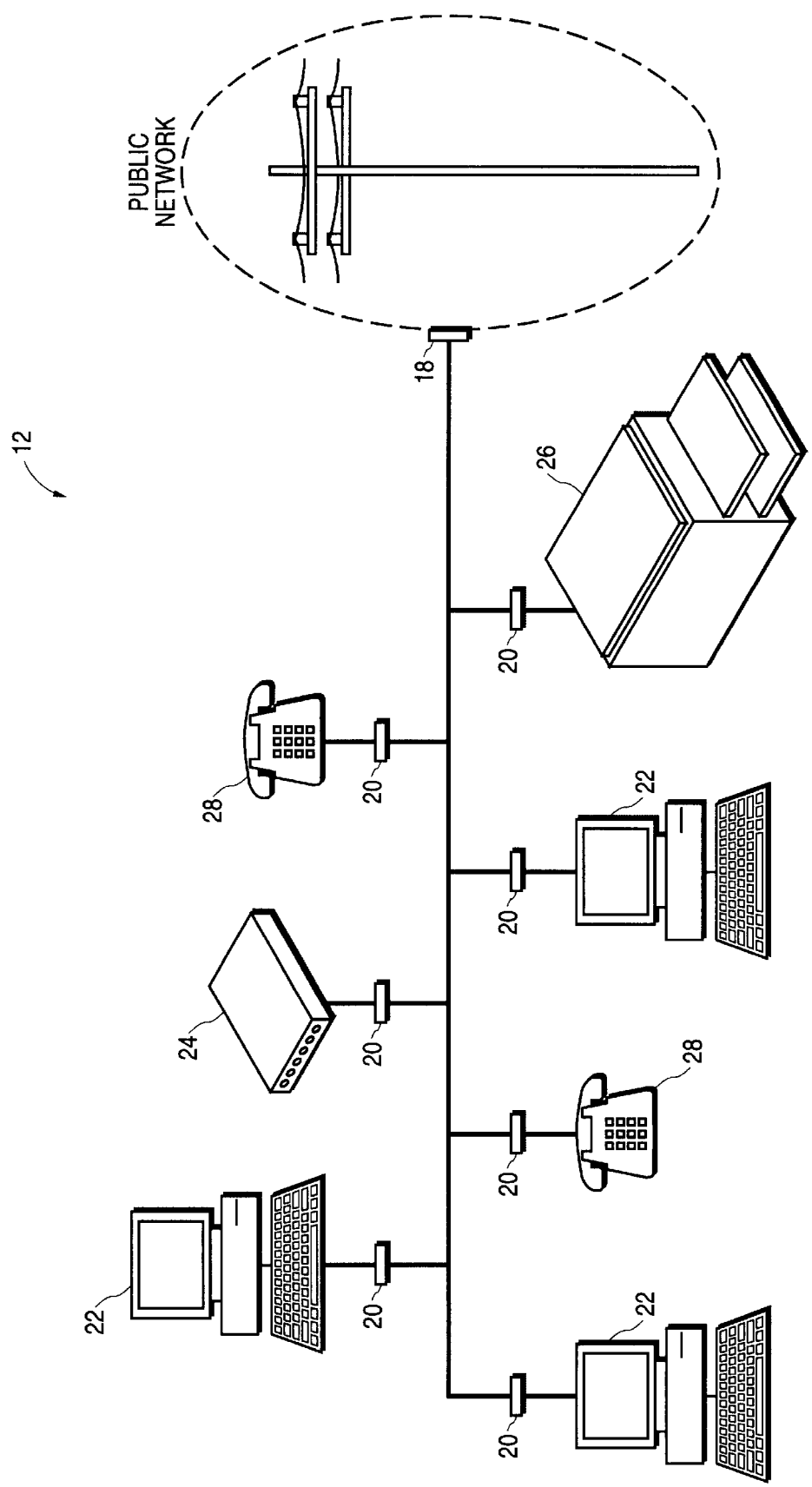

FIGS. 1a and 1b each illustrate a respective Local Area Network (LAN) 10 and 12 which may be implemented utilizing arbitrary topology POTS wiring 14, such as UTP wiring, within a residential building 16. The wiring 14 fans out from a central connection point 18, through which the wiring 14 is connected to a central office, to numerous phone jacks 20 located throughout the building 16. A number of LAN devices (also termed "stations" or "nodes"), such as computers 22, modems 24 or printers 26, may be coupled to the wiring 14 via the jacks 20. Regular telephones 28 are also shown to be coupled to the wiring 14 via respective jacks 20. A number of branches of the wiring 14 may furthermore terminate in jacks 20 into which LAN devices or telephones are not connected (i.e., open stubs), and are accordingly unterminated. As will be appreciated from FIG. 1a, the wiring 14 interconnecting the LAN devices has an irregular topology, and includes a number of unterminated branches. Impedance mismatches, the arbitrary topology, and the lack of termination within the LANs 10 and 12 result in the reflection of signals and unpredictable frequency responses within these LANs 10 and 12. Further, the star configuration illustrated in FIG. 1a serves to attenuate the levels of signal features whose duration is short compared to the propagation delay of the wire branches. The distance between LAN devices is also less than 500 feet.

Figure 2:
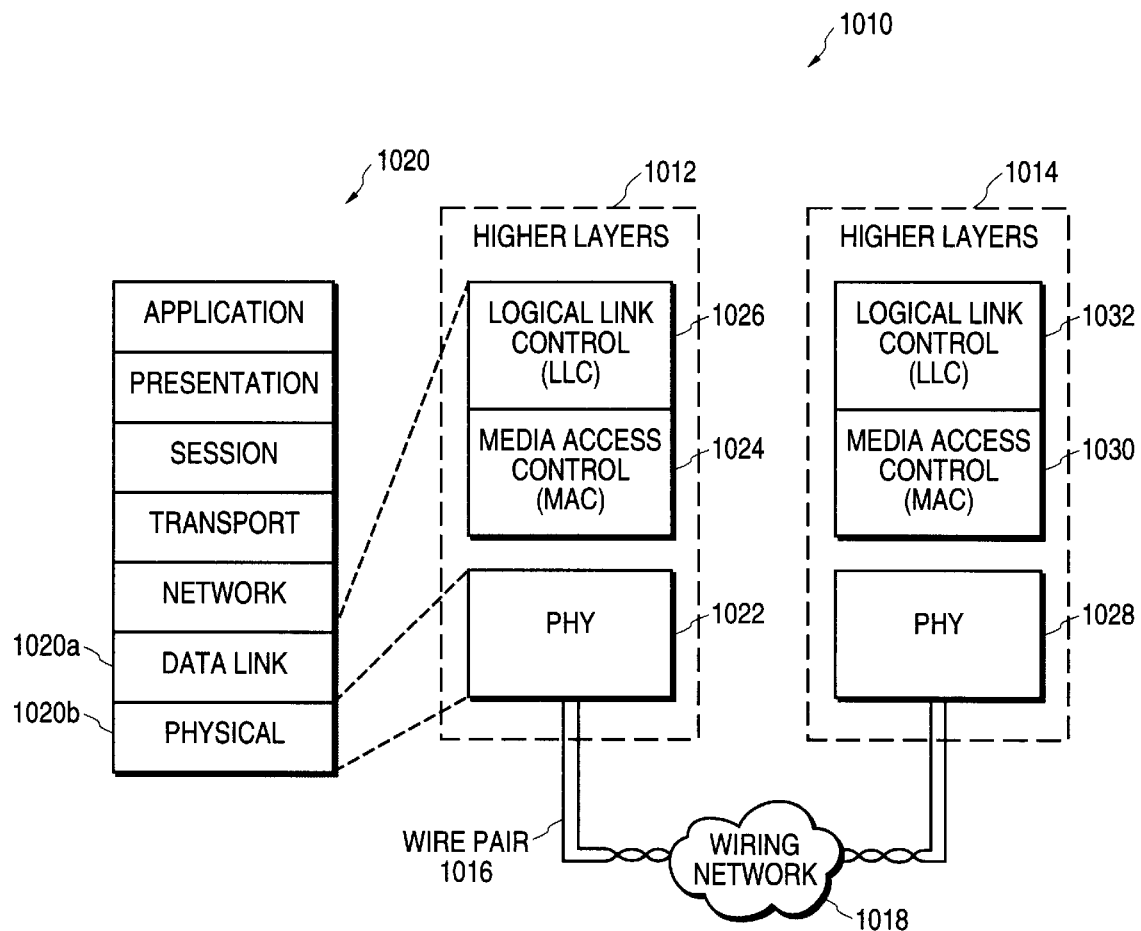
FIG. 2 is a diagrammatic representation of a mapping of networking device components to the OSI model.

FIG. 2 illustrates two exemplary networking devices 1012 and 1014, which are coupled via a wire pair 1016 to a wiring network 1018. Each of the networking devices 1012 and 1014 includes a physical layer device (PHY) 1022 or 1028, a media access controller (MAC) 1024 or 1030, and a logical link controller (LLC) 1026 or 1032. The various layers comprising the Open System Interconnect (OSI) networking model are illustrated at 1020, and the PHY 1022 is shown to implement the physical layer 1020A, while the MAC 1024 and the LLC 1026 are shown to implement the data link layer 1020B. In one embodiment, the present invention may reside primarily in the PHY 1022, and may adapt frames received from the MAC 1024 into a form suitable for reliable transmission over the wiring network 1018 via the wire pair 1016.

Figure 3:
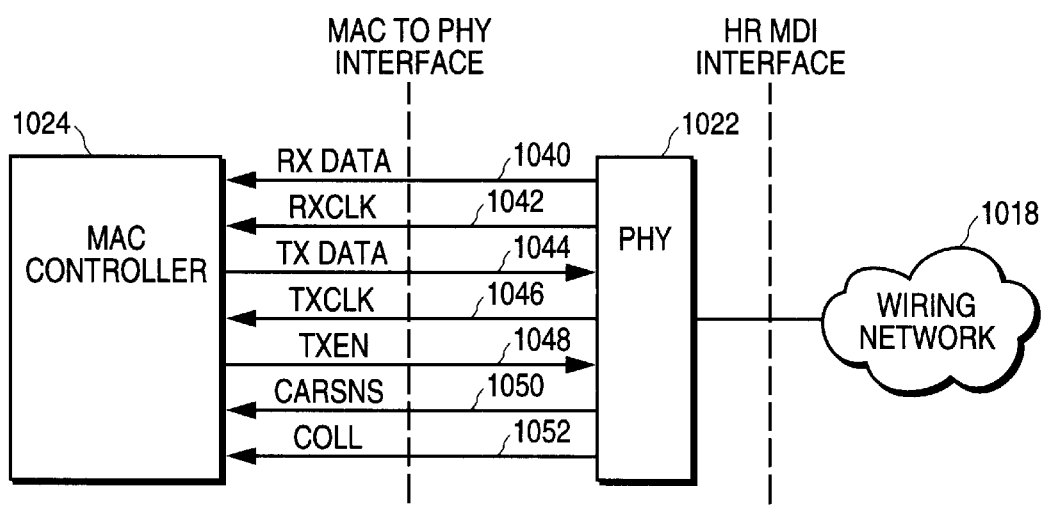
FIG. 3 is a diagrammatic representation of a MAC-to-PHY interface according to the present invention.

FIG. 3 provides further details regarding an exemplary embodiment of the MAC to PHY interface. Specifically, the interface includes a receive data signal 1040, which comprises data to the MAC 1024 from the PHY 1022. A receive clock signal 1042 is utilized to clock the receive data signal 1040. A transmit data signal 1044 comprises data propagated from the MAC 1024 to the PHY 1022. A transmit clock signal 1046 is utilized to clock the transmit data signal 1044. A transmit enable signal 1048 comprises a request from the MAC 1024 to the PHY 1022 to begin the transmission of data to the PHY 1022. A carrier sense signal 1050 indicates to the MAC 1024 that the PHY 1022 is receiving a valid carrier signal from the wiring network 1018. Finally, all collision signal 1052 indicates that a collision was detected by the PHY 1022 on the wiring network 1018.

While the MAC controller 1024 and the PHY 1022 are shown to be discrete components in FIG. 3, it will readily be appreciated that the MAC controller 1024 and the PHY 1022 may be integrated into a single device, in which case the above described signals will not be required. However, the functionality embodied in these signals should still be provided by the PHY component of any such integrated device.

Figure 4:
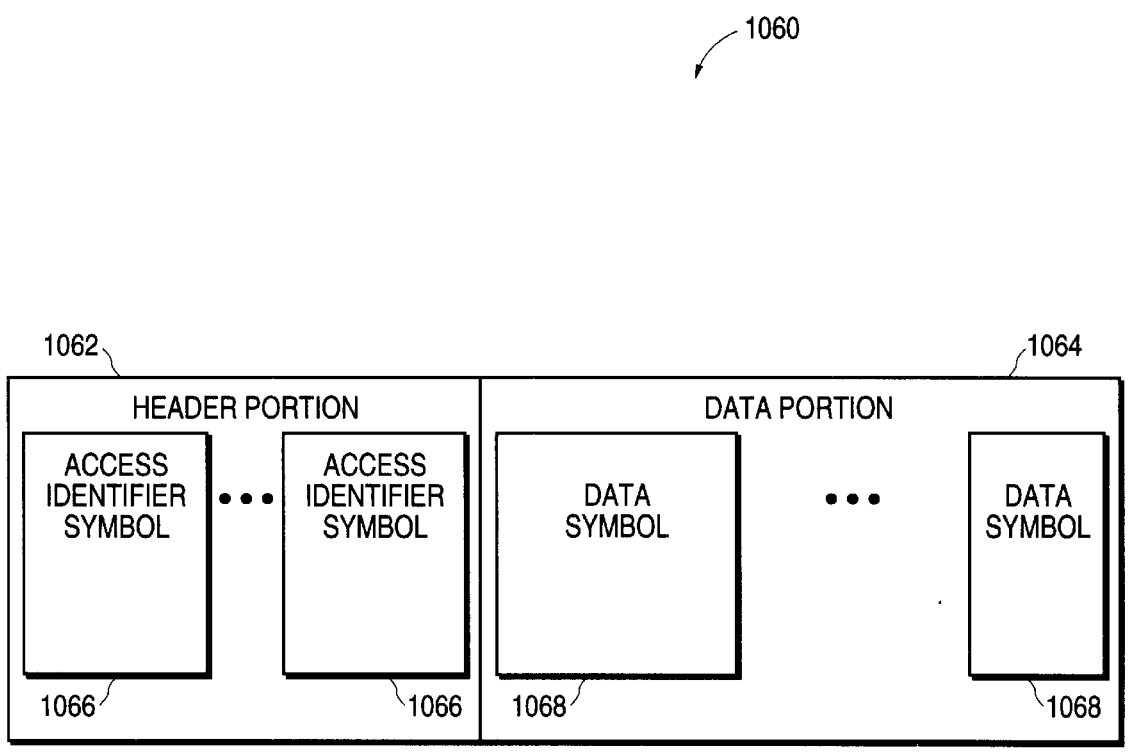
FIG. 4 is a diagrammatic representation of a frame constructed according to the teachings of the present invention.

FIG. 4 illustrates an exemplary embodiment of a frame 1060 (or data packet) constructed by the PHY 1022, according to the teachings of the present invention, for transmission over the wire pair 1016 within a structure. The frame 1060 comprises a header portion 1062 and a data portion 1064, each of the header and the data portions 1062 and 1064 in turn comprising a series of symbols. Specifically, the header portion 1062 includes a series of access identifier symbols 1066, which may be of a fixed length. The data portion 1064 comprises a series of data symbols 1068, which are of a variable length and, in one exemplary embodiment, encode an IEEE 802.3 Ethernet data package received from the MAC layer.

Figure 5:
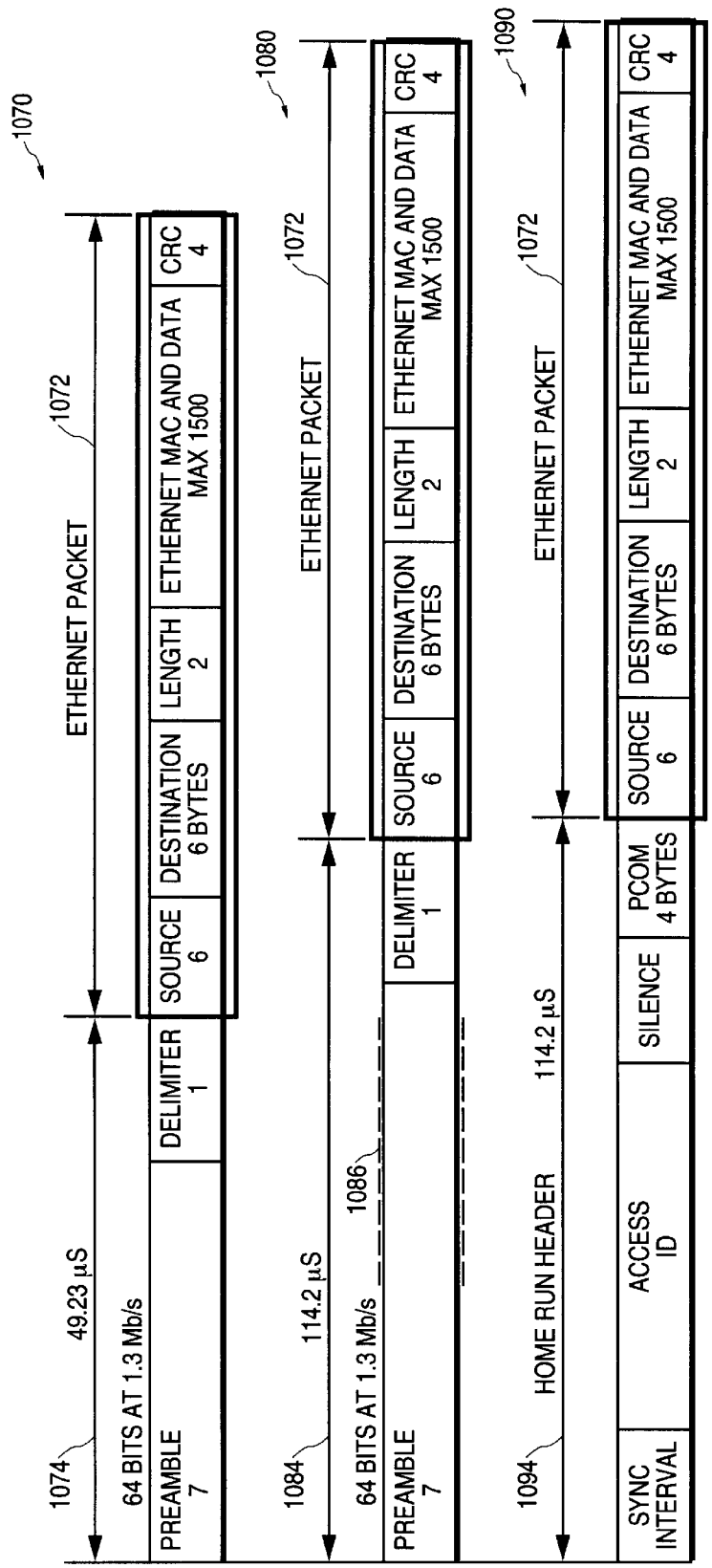
FIG. 5 is a block diagram showing the relationship between the MAC frame, and a frame constructed according to the teachings of the present invention.

FIG. 5 provides an exemplary illustration of the transformation of a transmission 1070 comprising a Ethernet packet 1070 having a preamble and delimiter 174 prefixed to the Ethernet packet 1072 into a transmission 1090 for propagation over the wire pair 1016. Specifically, the present invention proposes a method and apparatus whereby the PHY 1028 receives an Ethernet MAC frame (i.e., the transmission 1070) from the MAC controller 1024, strips away the eight octets comprising the preamble and delimiter 1074, and then replaces the preamble and delimiter 1074 with a header portion 1094 as described below. The present invention also proposes encoding both the header portion 1074 and the Ethernet packet 1072 as specific pulse sequences, as will be described in further detail below. In one exemplary embodiment, the step of transforming the transmission 1070 into the transmission 1090 comprises stretching the preamble and delimiter 1074 by introducing a "stretched clock" portion 1086 into the preamble to generate the intermediate header 1084, which comprises the contents of the delimiter and preamble 1074, but has a time duration of the header portion 1094.

Details on an exemplary embodiment on the invention, which implements the broad concepts discussed above with reference to FIGS. 2, 3, 4 and 5, will now be provided.

Figure 6:
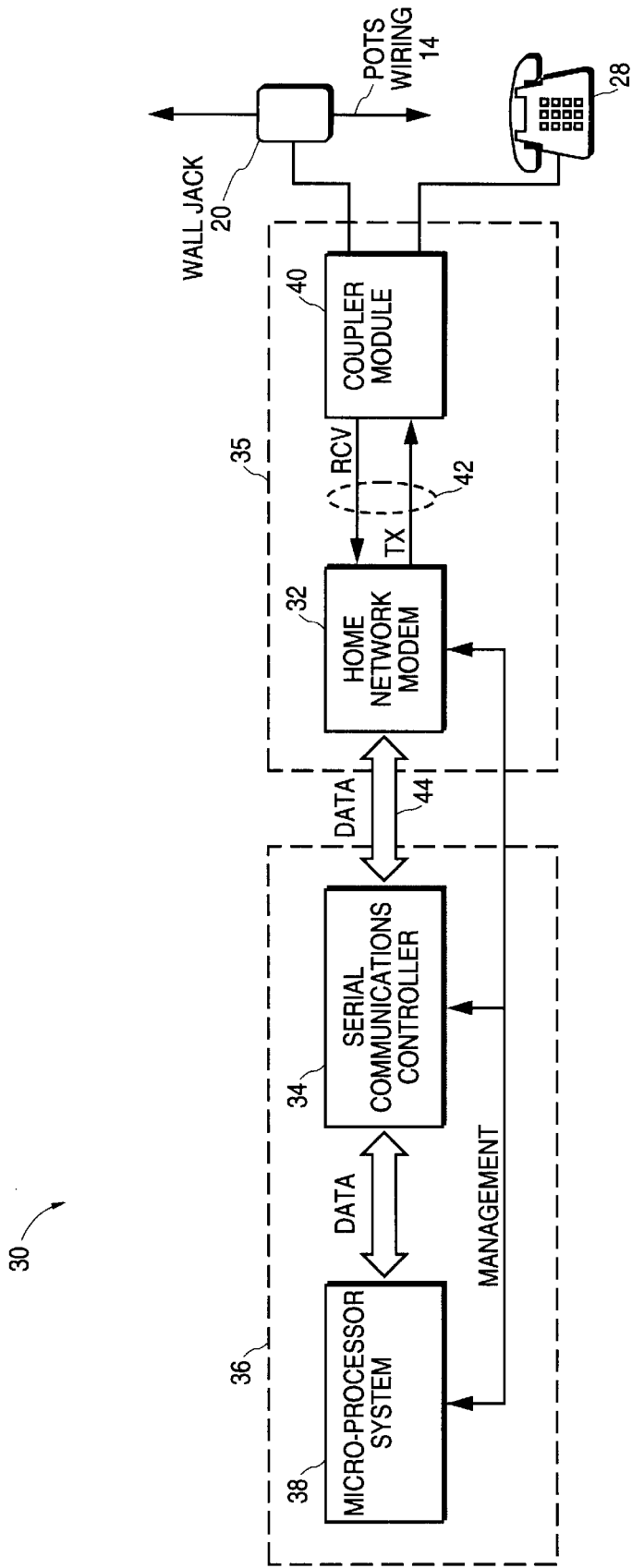
FIG. 6 is a diagrammatic representation of a network station according to one embodiment of the present invention.

Turning now to FIG. 6, there is illustrated a network station 30 coupled to a LAN via uncharacterized, arbitrary topology wiring, such as the POTS wiring 14 illustrated in FIGS. 1a and b. The network station 30 allows a number of well-known protocol, and LAN features to be implemented within the LANs 10 and 12. For example, the LAN 12 may use Ethernet, BISYNC or HDLC framing, and implement Collision Detecting, Collision Avoiding, TDMA, Polled or Token Passing access methods.

An overview of the various components of the network station 30 will now be provided. The station 30 comprises a network device 36 and an adapter 35. The adapter 35 includes a modem 32 that serves to adapt a communications controller 34 (such as an Ethernet communications controller) of the network device 36 (such as a computer) for communication over the arbitrary POTS wiring 14. The communications controller 34 may be an Ethernet communications controller operating according to the IEEE 802.3 standard or a High-Level Data Link Control (HDLC) serial controller. In an alternative embodiment, the communications controller may simply be a serial data interface or microprocessor, and the modem 32 may incorporate a Media Access Controller (MAC) 70 that interfaces a data stream from the controller 34 to circuitry within the modem 32 via an interface such as the General Purpose Serial Interface (GPSI) 60 described below.

The modem 32 may provide medium interface, signal encoding and decoding (ENDEC), clock recovery and collision detection functions. Exemplary embodiments of collision detection circuitry and functions that may be implemented within the adapter 35 are described in U.S. Pat. No. 5,963,539, entitled "METHOD AND APPARATUS FOR DETECTING COLLISIONS ON A NETWORK", filed Sep. 8, 1997, and assigned to the assignee of this application. To accommodate a variable bit rate encoding/decoding scheme, and to control the flow the data between the network device 36 and the wiring 14, the modem 32 controls the clocking of data to and from the communications controller 34. The modem 32 may further support Carrier Sense Multiple Access/Collision Detection (CSMA/CD) based Media Access Control (MAC) layers and accordingly provide carrier detect and collision indication signals. The modem 32 is furthermore shown to be coupled to a microprocessor system 38 of the network device 36 via a management interface, which allows the modem 32 to be controlled by software executing within the microprocessor system 38. The adapter 35 further incorporates a coupler module 40 by which the network station 30 is coupled to the jack 20 and POTS wiring 14. The coupler module 40 includes a pair of RJ-11 ports through which the wall jack 20 and the telephone 28 are coupled to the network device 36. The coupler module 40 is furthermore connected to the modem 32 via a transmit/receive connection 42.

A filter (not shown) is incorporated within the coupler module 40, and acts as a bandpass with a lower cutoff frequency of around 400 kHz and upper cutoff frequency around 4 MHz. The filter is AC coupled to the wiring 14 to prevent interference with POTS operations. Further details of the coupler module 40 are not pertinent to an understanding of the present invention.

Referring now to the network device 36, the communications controller 34 is typically responsible for Link-Layer protocol functions, such as framing, error detection, address recognition and media access. The microprocessor system 38 is responsible for the execution of software that controls the controller 34 and the modem 32. The microprocessor system 38 is furthermore shown to be coupled to the controller 34 via a data bus 44, and the controller 34 is similarly coupled to the modem 32.

The adapter 35 thus allows a network device 36, including a communications controller 34, such as an Ethernet controller, to be coupled to a LAN implemented using POTS wiring 14, and serves to encode data transmitted from the network device 36 onto the LAN into a format suitable for propagation over the wiring 14. Similarly, the adapter 35 decodes signals received via the POTS wiring 14 into a format suitable for reception by the controller 34. While the adapter 35 is shown in FIG. 6 to reside outside the network device 36, it will be appreciated that the adapter 35 could in fact be incorporated within the network device as, for example, part of a Network Interface Card (NIC). Alternatively, the adapter 35 may comprise a stand-alone unit that is coupled between a serial port of the network device 36 and the wall jack 20.

Figure 7:
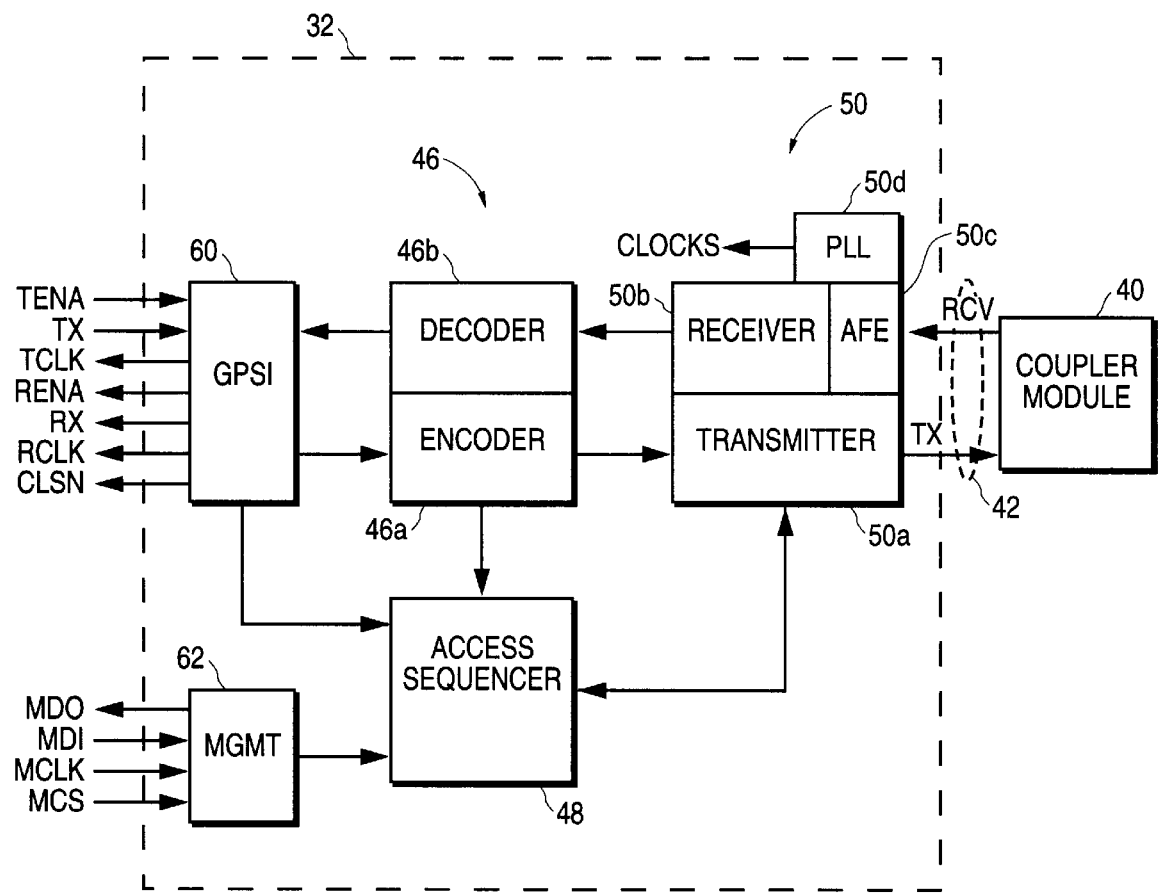
FIG. 7 is a diagrammatic representation of a modem, according to one embodiment of the present invention, included within the network station shown in FIG. 6.

FIG. 7 is a block diagram providing a more detailed view of the components of the modem 32. Specifically, the modem 32 comprises an encoder/decoder (ENDEC) 46 which is responsible for encoding a bit sequence as a symbol for transmission over a carrier medium such as the POTS wiring 14. Similarly, the ENDEC 46 is responsible for decoding a symbol received from the wiring 14 to generate a bit sequence. The encoding and decoding operations performed by the ENDEC 46 will be described in further detail below. The ENDEC 46 furthermore supplies both transmit and receive clocks to the communications controller 34 or, in an alternative embodiment, to a MAC within the modem 32. Overall operation of the ENDEC 46 is under the control of an access sequencer 48. The access sequencer 48 selects a general mode of operation for the ENDEC 46 and for the modem 32 as a whole, and controls the flow of data between the modem's subsystems and interface. The access sequencer 48 is also responsible for implementing collision detection within the modem.

The modem 32 further includes receiver/transmitter circuitry 50, which is responsible for the reception and transmission of access identifier symbols for use in collision detection, and data symbols that encode bit sequences. In one embodiment of the invention, such access identifiers and data symbols may be delimited by, or include, electrical pulses. A transmitter 50a within the circuitry 50 receives symbol and polarity information, synchronized to a master clock, from the ENDEC 46. In one embodiment, the symbol information received from the ENDEC 46 represents the variable-duration (or encoding) portion of an electrical composite symbol to be propagated from the transmitter 50a. In one embodiment of the present invention, the transmitter 50a appends a fixed-duration (or buffer) portion to the variable-duration portion to generate a composite symbol. The transmitter 50a then generates symbol delimiters, which determine the time duration and polarity of the composite symbol, in the form of pulse doublets. Each pulse doublet comprises first and second portions of approximately equal duration and opposite polarity, and has a fixed pulse width. The polarity of each pulse doublet is determined by information received from the ENDEC 46. As each pulse doublet comprises two equal portions of equal duration and opposite polarity, no Direct Current (DC) component is generated on the wiring 14 when the pulse doublet is transmitted thereon. Compliance with FCC Part 68 requires that the voltage levels of each pulse doublet be substantially less than would be generated when driving the coupler module 40 at Transistor-Transistor Logic (TTL) levels. A reduction in the voltage levels of each pulse may be accomplished by incorporating a series of resistors, or step-down windings, in a coupling transformer within the circuitry 50. In one embodiment, each pulse doublet comprises a single cycle of a 2 MHz sine wave.

In an alternative embodiment, as described in further detail below, the data symbol delimiter may comprise a multi-cycle waveform. Similarly, an electrical pulse included within an access identifier symbol may comprise a pulse doublet, as described above, or a multi-cycle waveform as described in further detail below.

Figure 11:
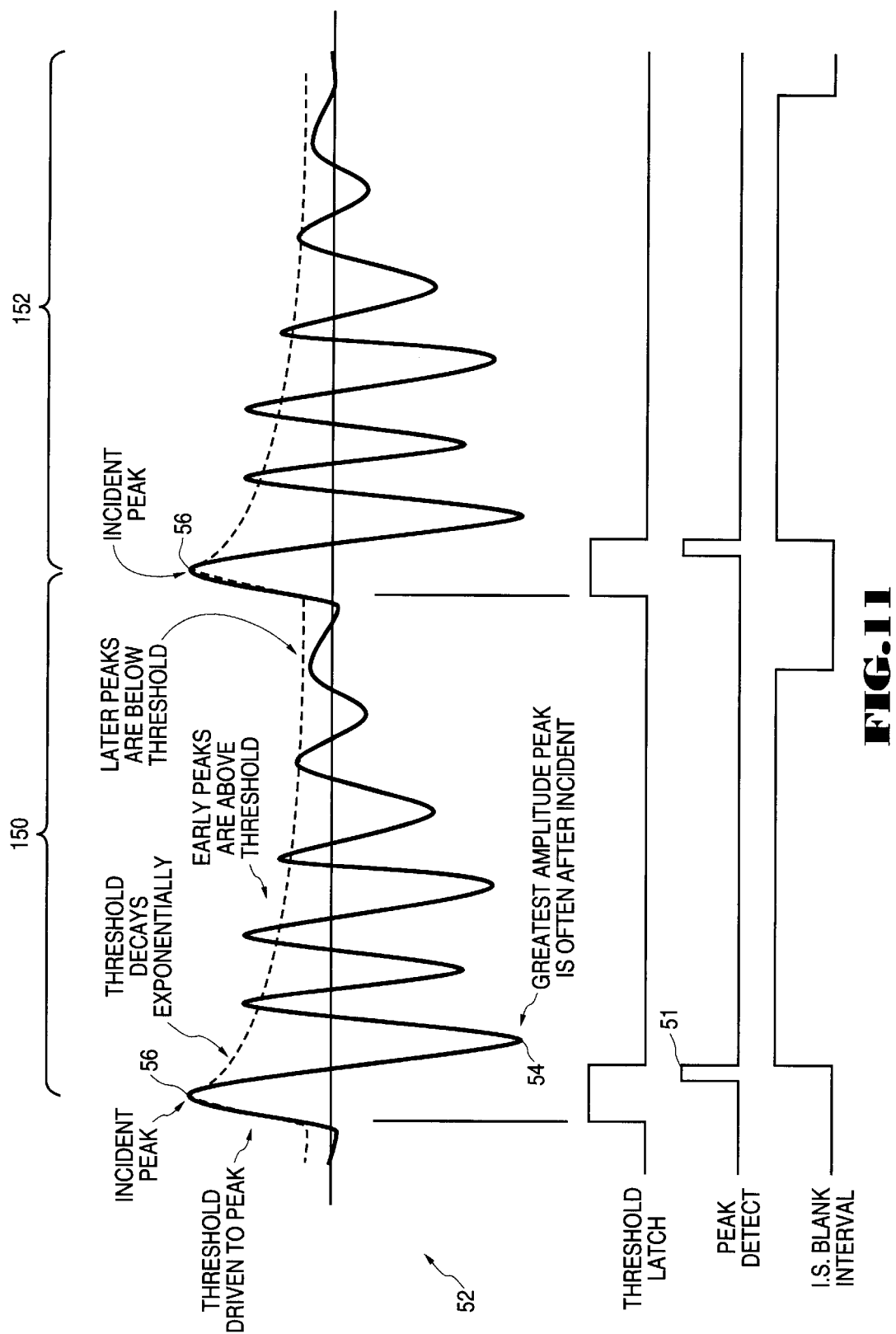
FIG. 11 illustrates a waveform generated on POTS wiring by the application of a pulse thereto.

The circuitry 50 also includes a receiver 50b, which comprises gain elements, comparator and digital control circuitry. The receiver 50b produces an output pulse, shown at 51 in FIG. 11, coincident with the first peak (i.e. the inflection point) of a complex waveform received by the wall jack 20 off the wiring 14. FIG. 11 provides an illustrative example of a waveform 52 that may be received at the receiver 50b off the wiring 14. The waveform 52 may be highly attenuated and distorted as a result of being propagated through a residential POTS wiring 14. As shown at point 54, reflections can result in a peak amplitude occurring sometime after arrival of the incident energy. Without line terminations and with complex topologies, pulse energy can continue for many microseconds, decaying gradually.

As mentioned above, the present invention proposes encoding a bit sequence as a symbol, the symbol having a time duration indicative of the bit sequence and being determined by first and second delimiters. In one embodiment of the invention, these delimiters comprise electrical pulses transmitted from a transmitter 50a. Thus, in order successfully to receive a symbol at the receiver 50b, the original pulses generated from a transmitter 50a must be as accurately reproduced as possible. To this end, the receiver 50b is required to detect the first peak of any incident waveform, as the precise time of arrival of these incident peaks must be determined to ascertain the time duration of a symbol. Accordingly, the receiver 50b is configured to detect the first incident peak, such as the peak 56, of the incident waveform 52, and to ignore potentially high amplitude pulses occurring soon after such an incident peak. Further details regarding the functioning of the receiver 50b are provide below.

Referring again to FIG. 7, the modem 32 also includes system interfaces in the form of a General Purpose Serial Interface (GPSI) 60 and a management interface 62. The GPSI 60 allows the modem 32 to control the clocking of data into and out of the communications controller 34. Table 1 below provides the details of the GPSI 60 signal lines:

TABLE 1

| Signal Name | Direction | Description |
| --- | --- | --- |
| TENA | To Modem | Transmit Enable. Qualifies TX as containing packet data |
| TX | To Modem | Transmit data to encoder |
| TCLK | From Modem | Transmit Clock. Runs continuously when TXENA deasserted, stopped while Access ID, (detailed below) runs at variable rate under control of transmit encoder during transmission. |
| RENA | From Modem | Receive Enable. Qualifies RX as containing packet data. |
| RX | From Modem | Receive data from decoder. |
| RCLK | From Modem | Receive Clock. Runs continuously when the wire is idle, is stopped during reception of an Access ID (detailed below), runs at variable rate under control of the decoder during packet reception. |
| CLSN | From Modem | Collision Sense. Indicates either a transmit or receive mode collision. |

TABLE 1-continued

The management interface 62 is a simple 4-wire serial interface for setting and reading management configuration information. A microprocessor within the communications controller 34 uses this interface to establish the speed of operation, and to set the access sequencer's 48 mode of operation. In one embodiment the communications controller 34 is an Ethernet controller, and the management parameters for the modem 32 are stored in a serial EEPROM, and loaded automatically every time the controller 34 is reset or initialized. Table 2 below details the relevant signal pins and management configuration data:

TABLE 2

| Signal Name | Direction | Description |
| --- | --- | --- |
| MDO | From Modem | Serial data stream readout of modem configuration parameters. |
| MDI | To Modem | Serial data stream settings of modem configuration parameters. |
| MCLK | To Modem | Serial data clock. Data is shifted in/out on the rising edge of this signal. |
| MCS | To Modem | Chip select. Qualifies and frames activity on the serial data channel. First data bit is received/transmitted following assertion of this signal. Configuration data is loaded into internal registers upon transition to deasserted state. |

The receiver 50b further includes an Analog Front End (AFE) 50c and a Phase-Lock Loop (PLL) circuit 50d. The AFE 50c shapes transmit pulses, and finds and indicates to the receiver 50b the time (temporal) location of the incident peak of a received waveform (pulse).

Figure 8:
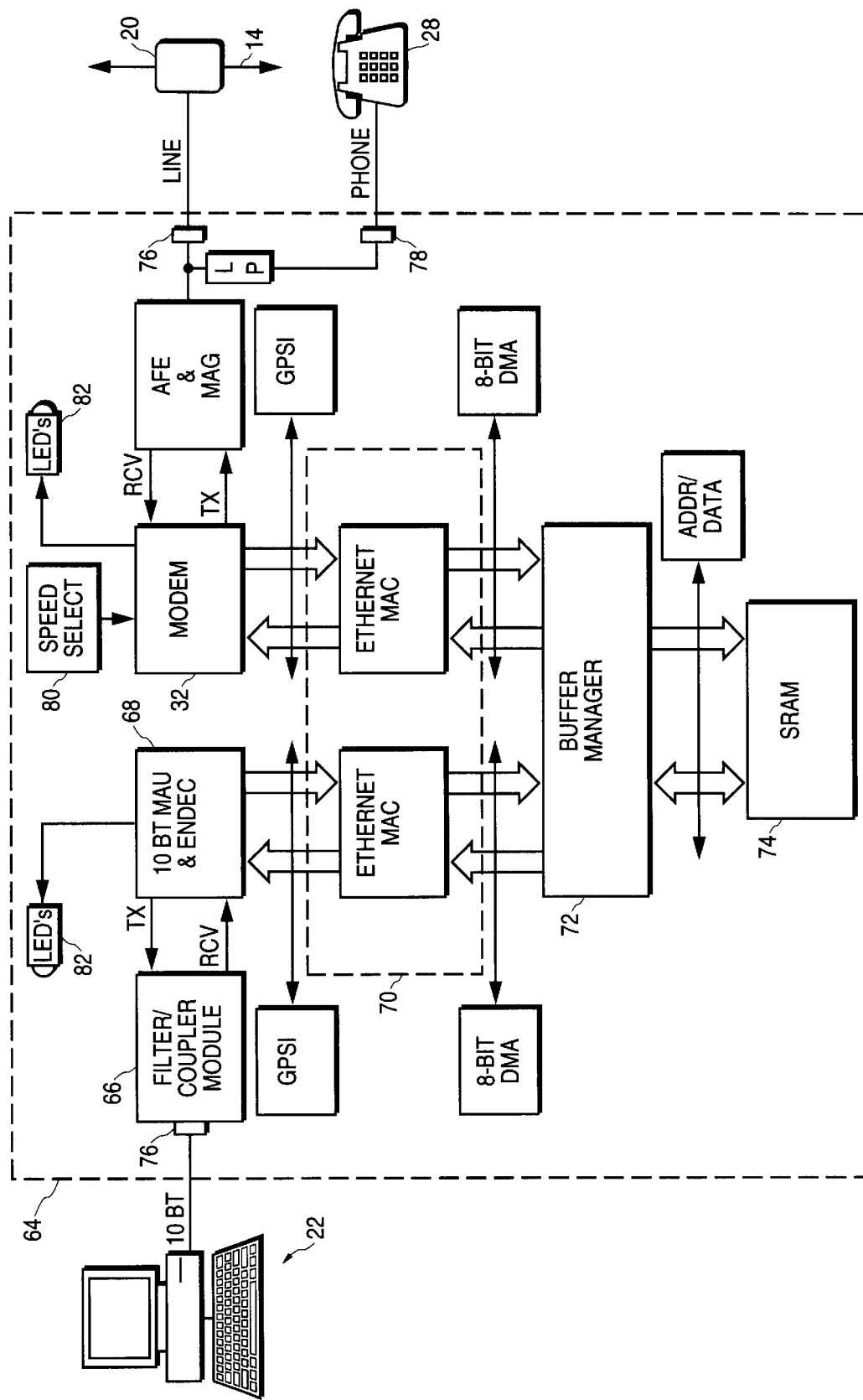
FIG. 8 is a diagrammatic representation of a 10baseT-to-POTS adapter, according to one embodiment of the present invention.

FIG. 8 illustrates the modem 32 included within an adapter 64, which allows a computer 22 including a 10BaseT Ethernet communications controller to communicate over a LAN implemented using POTS wiring 14. The adapter 64 includes a filter/coupler module 66, a 10BaseT Media Access Unit (MAU), an ENDEC 68, an Ethernet MAC Controller 70, a buffer manager 72, and a Static Random Access Memory (SRAM) 74. The adapter 64 acts as a non-filtering bridge, and receives packets from either interface, buffers such packets temporarily, and transmits them to the opposite interface as soon as possible. Specifically, the buffer manager 72 uses the SRAM 74 to emulate two large FIFO memories buffering packets being transferred between 10BaseT and the POTS wiring 14. In one embodiment, the adapter 64 does not have a MAC LAN address. The adapter 64 further includes a RJ-45 connector 76 for 10BaseT access, and two RJ-11 connectors 78. A speed selector 80 allows a user to configure the transmission speed of the adapter 64. The adapter 64 also includes an array of diagnostic Light Emitting Diodes (LED's) 82.

Data Symbols—Encoding

As a result of the arbitrary topology and the unterminated nature of the POTS wiring, the present invention proposes encoding predetermined bit sequences as respective symbols for transmission. In one embodiment, each symbol is distinguished by having a specific time duration, this time duration being determined by the time interval between the generation or receipt of first and second delimiters, in the form of electrical pulses. The present invention proposes encoding data in the precise time generation or arrivals of short duration pulses that are widely separated in time. As described above, a transmitted pulse is attenuated and scattered as it bounces around the wiring 14. After enough time has elapsed, the pulse will die out and another can be sent without fear of interference from the previous pulse. Specifically, once the reflections resulting from a particular pulse drop below a receiver's sensitivity threshold, another pulse can be sent without risking inter-symbol interference. Reference made to FIG. 11 that shows the waveform 52 received at a receiver 50b in response to the transmission of a sinusoidal pulse from a transmitter 50a. As illustrated, in one embodiment of the present invention receiver's sensitivity threshold may decay exponentially after detection of a first peak 56.

For the purposes of this specification, it is convenient to specify a time unit in which the time between the transmission of pulses can be expressed. To this end, a time unit arbitrarily termed a TIC is defined as comprising 0.1167 microseconds.

Figure 9:
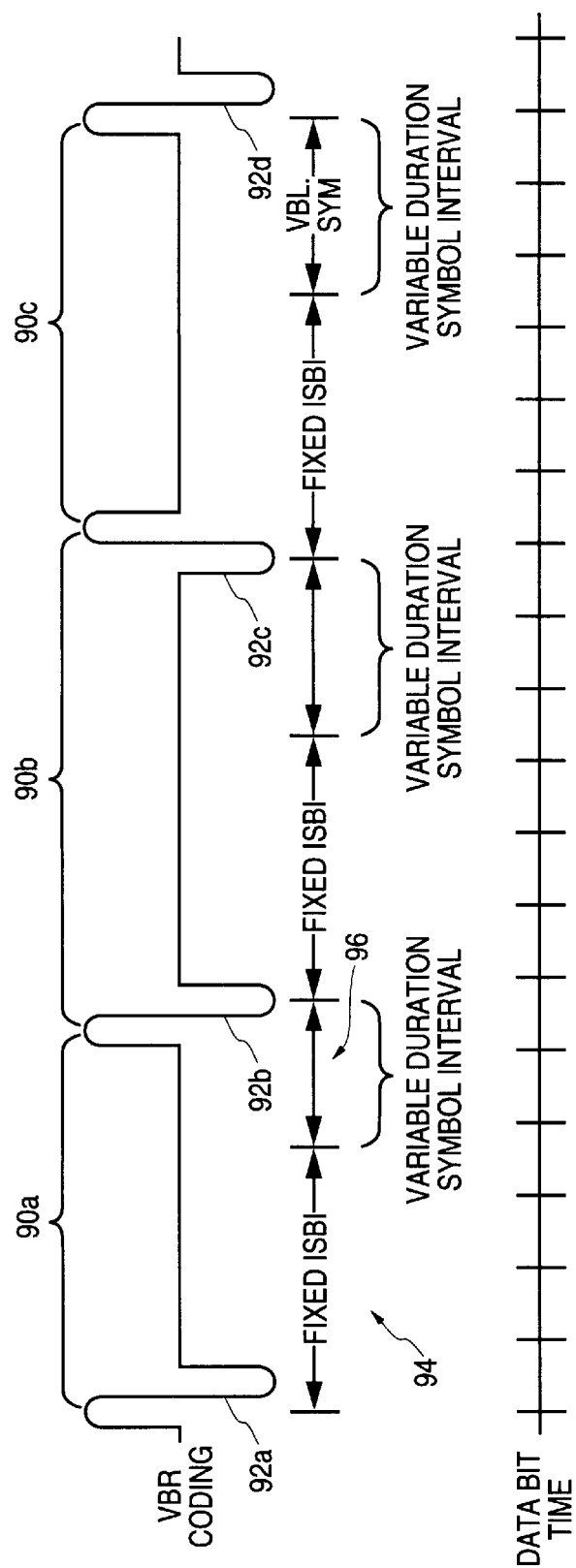
FIG. 9 illustrates a sequence of symbols, each encoding a bit sequence and constructed according to the teachings of the present invention.

Referring now specifically to FIG. 9, a series of sequential symbols 90a–90c are shown to be separated and distinguished by a series of pulses 92a–92c transmitted from a receiver 50b over the wiring 14. Each symbol 90 has a predetermined duration indicative of a respective bit sequence. A minimum time must separate each of the pulses 92 from a preceding pulse, so as to allow reflections resulting from the pulse 92 to decay below a receiver's 50b threshold. This minimum time is included within each symbol 90, as a fixed-duration (or buffer) symbol portion, and may be conveniently referred to as an Inter-Symbol Blanking Interval (ISBI) 94. The duration of the ISBI 94 is determined by a number of factors, such as the complexity of the POTS wiring topology, the impedance of terminators (e.g., telephones) on the ends of each wiring branch, and random noise on the line which may add to the amplitude of decaying reflections. In one exemplary embodiment, the ISBI 94 has a duration of between 1 and 5 microseconds, and specifically of 2.1 microseconds (i.e., 20 TICs within a modem 32 operating at 60 MHz.) It will be appreciated that the ISBI 94 effects the transmission data rate, and it is desirable to have the ISBI 94 as short as possible.

Each symbol 90 is furthermore shown to comprise a variable duration symbol portion 96 indicative of a predetermined bit sequence. The symbol portion 96 may be expressed as an integer multiple of the TIC time interval, and the duration of a symbol may thus be expressed as ISBI+ D*TIC, where D is an integer. The above described time periods are suited particularly to a POTS wiring-based network wherein network devices are separated by 500 feet of POTs wiring.

Figure 10:
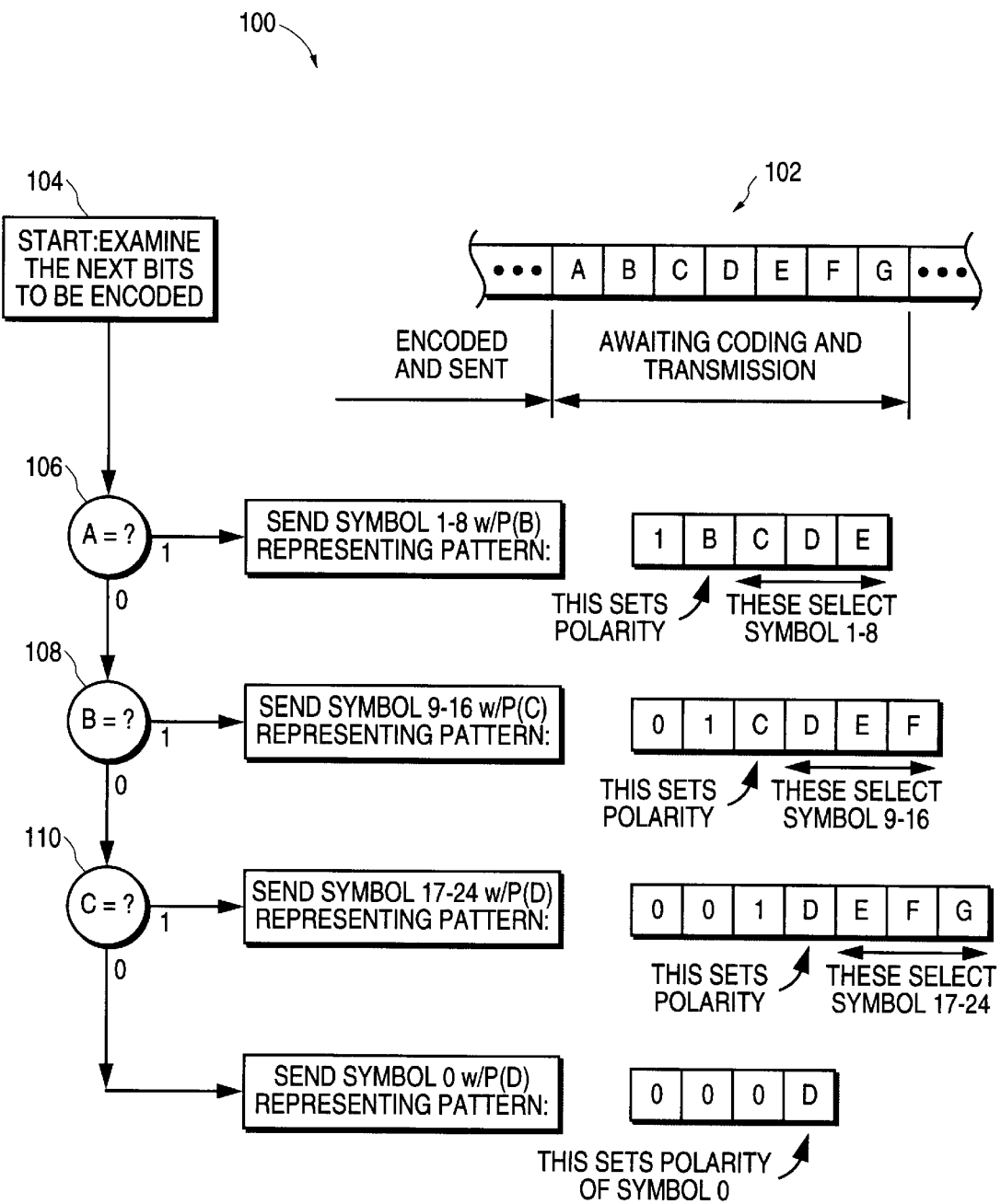
FIG. 10 is a coding tree illustrating a method, according to one embodiment of the present invention, of coding a bit sequence.

An exemplary method of encoding a bit stream as a sequence of symbols 90 will now be described with reference to FIG. 10. Specifically FIG. 10 shows a coding tree 100 illustrating a method a coding a bit stream. The encoding is performed by the ENDEC 46, which includes a shift register receiving bit stream 102 from the communications controller 34 via the GPSI 60. For the purposes of explanation, the encoding of a specific bit sequence, comprising bits A–G of bit stream 102, will be explained. The encoding method begins at step 104 with an examination of the next bit to be encoded (i.e. bit A). At step 106 a determination is made as to whether bit A is a one (1). If so, the next bit (i.e. bit B) determines the polarity of a pulse which will comprise a delimiter of a symbol representing bits A–E. The next three bits (i.e. bits C–E) select one of a first set of eight symbols (Symbols 1–8). Each of the Symbols 1–8 includes the fixed ISBI 94, as well as the variable-duration symbol portion 96.

Alternatively, if it is determined at step 106 that bit A is a zero, the method proceeds to step 108, where a determination is made as to whether bit B is a one or a zero. If bit B is a one, then bit C determines the pulse polarity and the next three bits (i.e. bits D, E and F) select one of eight symbols in a second group (Symbols 9–16).

If both bit A and bit B are zeros, then the method proceeds to step 110, where a determination is made as to whether bit C is a one or a zero. If bit C is a one, then bit D determines the pulse polarity and the next three bits (i.e. bits E, F and G) select which of a third group of eight symbols (Symbols 17–24) is selected to encode the bit pattern. If bits A, B and C are all zeros, then bit D selects the polarity and a Symbol 0 is selected to represent the bit pattern.

Accordingly, it will be appreciated that Symbol 0 encodes a 4-bit sequence 000D, Symbols 1–8 encode a 5-bit sequence 1BCDE, Symbols 9–16 encode a 6-bit sequence 01CDEF and Symbols 17–24 encode a 7-bit sequence 001DEFG.

The encoding method thus encodes bit sequences in groups of varying sizes, specifically in groups either 4, 5, 6, or 7 bits. The symbols are assigned to the encoded bit sequences in a manner that causes more data bits to be encoded in symbols having a greater duration. For example, symbols 17–24 will include variable-duration symbol portions 96 that are longer in time duration than the variable-duration symbol portions 96 of Symbols 1–8. This allows optimal average and minimum bit rates to be achieved. The encoding of a bit utilizing the polarity of a pulse that acts as a delimiter for the symbol also contributes towards optimization of the encoding methodology.

Figure 12A:
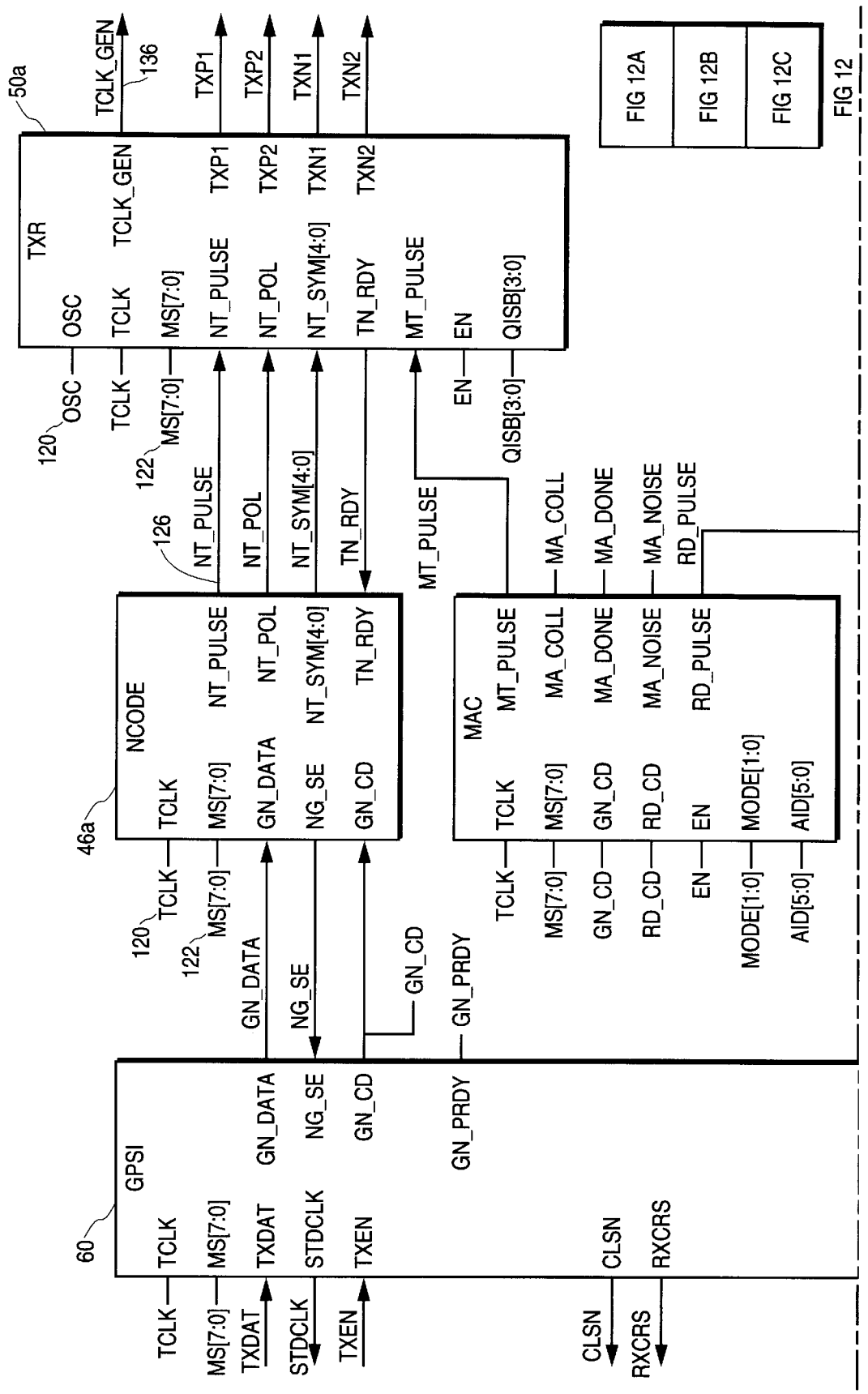
FIG. 12 is a schematic illustration of an exemplary embodiment of the modem shown in FIG. 7.
Figure 12B:
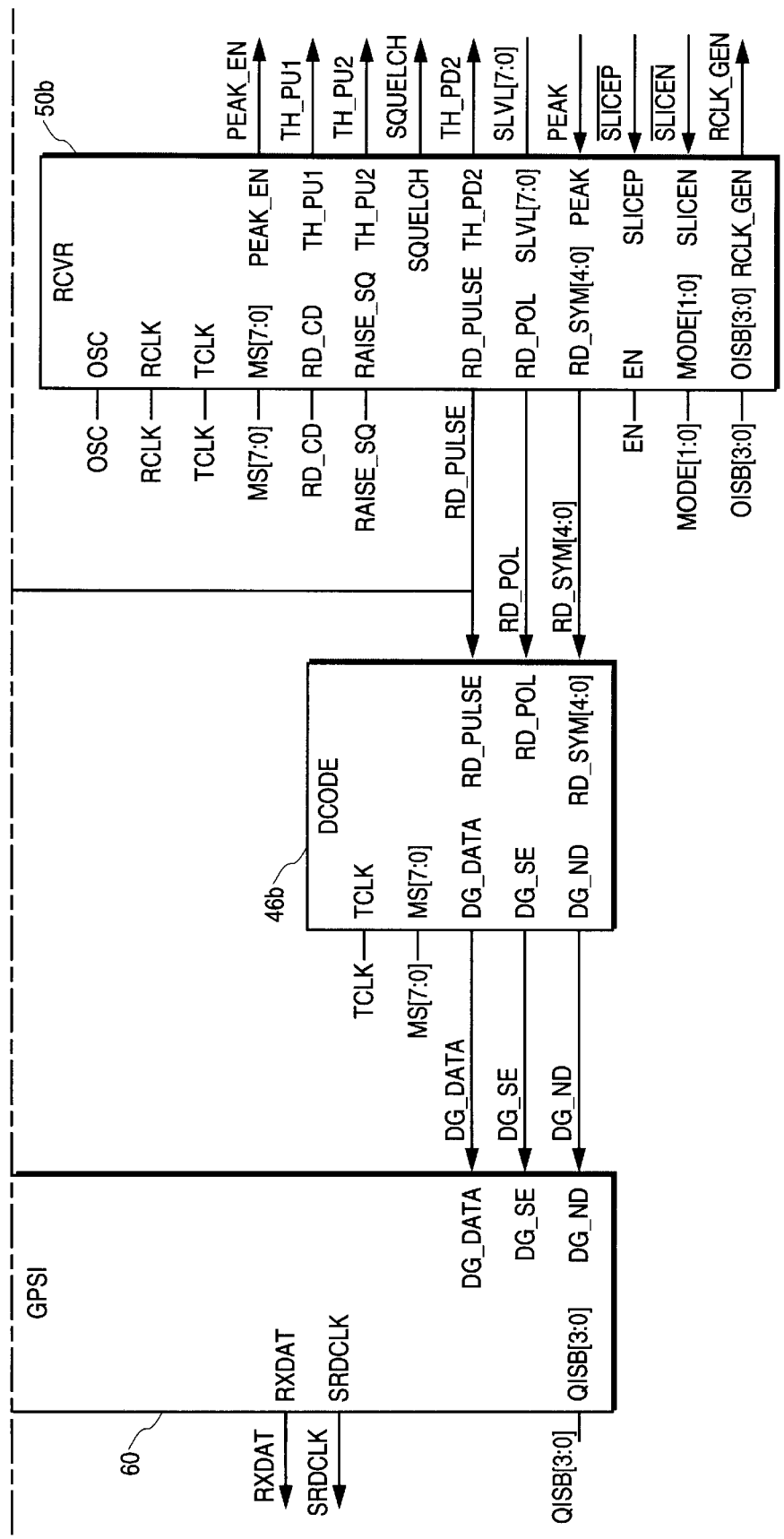
Figure 12C:
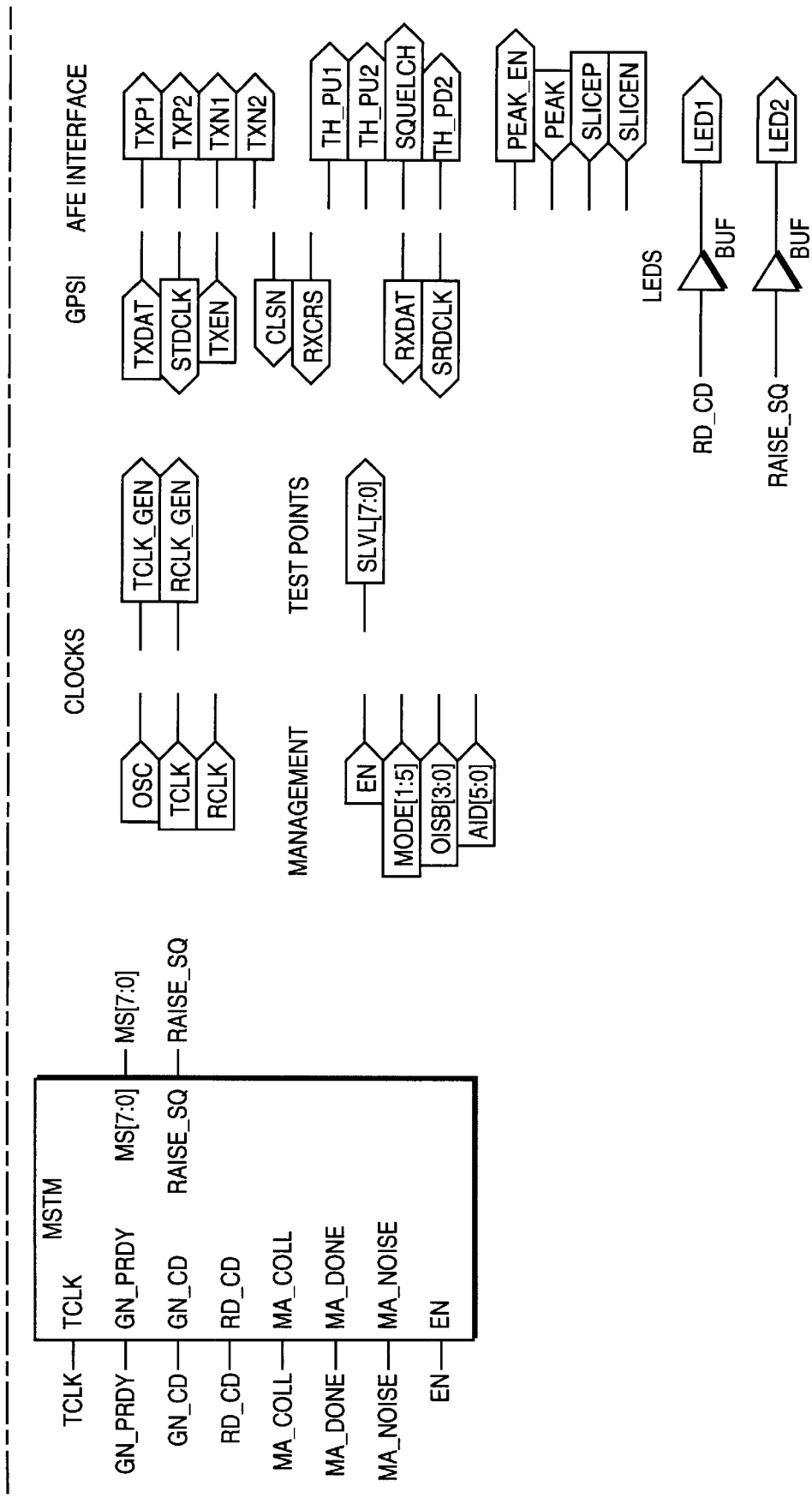
Figure 13A:
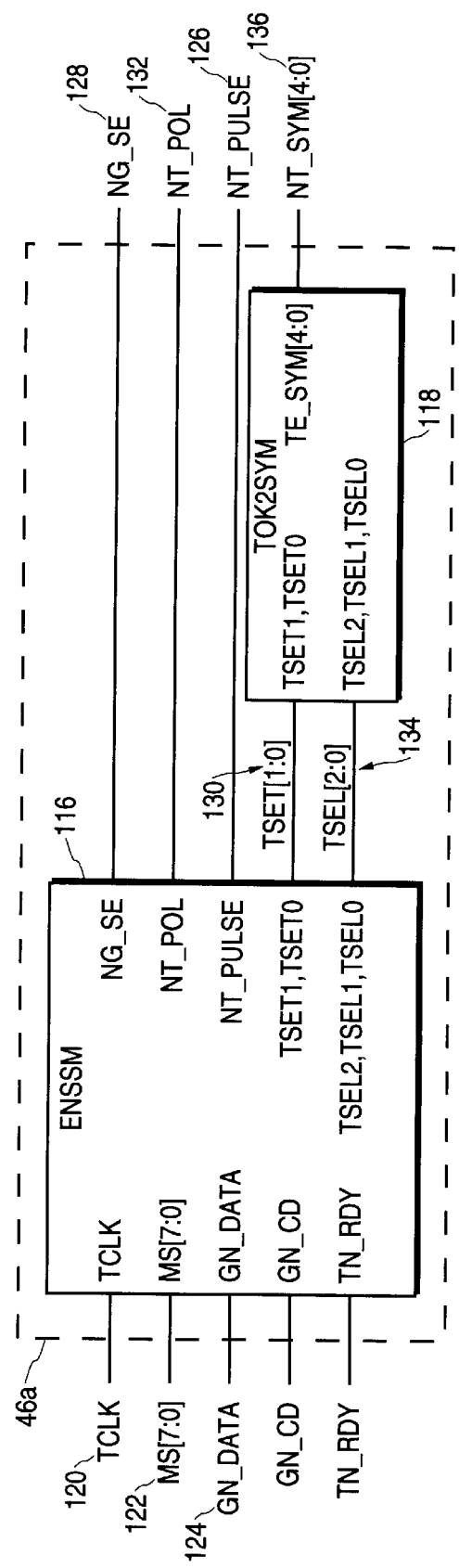
FIGS. 13a and 13b are schematic illustrations of an encoder and a decoder included within the modem shown in FIG. 12.

FIGS. 12 and 13a illustrate an exemplary embodiment of the modem 32 implemented using Field Programmable Gate Arrays (FPGAs). The encoder 46A is shown in FIG. 13a to comprise an encode state machine 116 and a token-to-symbol conversion circuit 118. The encode state machine receives a TIC clock (TCLK) signal 120, and a Master State (MS [7:0]) signal 122 which indicates the master state of the modem 32 and is generated by the access sequencer 48. The encode state machine 116 also receives data to be encoded via input (GN_DATA) 124 from the communications controller 34 via the GPSI 60. The outputs of the encode state machine 116 include the following signals:

1. NT_Pulse 126: Assertion of this signal instructs the transmitter to send a pulse and to accept a next symbol for transmission;
2. NG_SE signal 128: Assertion of this signal informs the GPSI 60 to shift out another bit;
3. NT_POL 132: This signal represents the data bit which follows the bits used to select the group of symbol from which the transmitted symbol is selected, and sets the polarity of the next symbol delimiter (or pulse);
4. TSET [1:0] signal 130: This signal encodes whether the next bits are 000,01 or 001 (i.e. selects the set of eight symbols from which the symbol is selected); and
5. TSEL [2:0] signal 134: This signal comprises the three select bits following the polarity bit indicated by the NT_POL signal 132 and is used to select a symbol from within a group of eight symbols.

The token-to-symbol conversion circuit 118 receives the TSET [1:0] signal 130 and the TSEL [2:0] signal 134 from the state machine 116, and generates the symbol to be transmitted, represented by the NT_SYM [4:0] signal 136. The symbol (i.e. the NT SYM [4:0] signal 136) is propagated to the transmitter 50*a*, as shown in FIG. 12, which adds to this symbol the ISBI portion 94 to thereby generate the composite symbol. The transmitter 50*a* waits for a number of TICs represented by this composite signal between the transmission of delimiter pulses.

Operation of the embodiment of the encoder 46*a* shown in FIGS. 12 and 13 will now briefly be described. Firstly, the NT_pulse signal 126 is asserted, causing a pulse to be transmitted from the transmitter 50*a*. The transmitter 50*a* further includes an interpulse timer (not shown) which begins a timed record from issuance of this pulse. Next, the shift register within the encoder state machine 116 is reset and the NG_SE signal 128 is asserted to receive a bit from the GPSI 60. The contents of the shift register are then shifted to the left and examined until one of four patterns is recognized (i.e. 000,1,01,001). If one of these patterns is found, shifting stops and decoding logic within the encoder 46*a* encodes the bit pattern as a number "0..3". The TSEL2..TSEL0 and NT_POL signals are then outputted to indicate the symbol select and the polarity. External combinational logic in the encoder 46*a* (i.e. the conversion circuit 118) and the transmitter 50*a* convert this information into a number of TICs between pulses needed to encode the bit sequence. Specifically, the transmitter 50*a* receives pulse and polarity information synchronized to the TIC clock signal 122 and then generates a pulse doublet, which comprises a sinusoidal pulse of a fixed width and of a polarity determined by the NT_POL signal 132. The transmitter 50*a* transmits this pulse on the TXP and TXN outputs. The time at which to generate this delimiting pulse is determined in accordance with the symbol information sent to the transmitter 50*a* by the encoder 46*a* and in accordance with the transmitter inter-pulse timer.

Data Symbols—Decoding

Figure 13B:
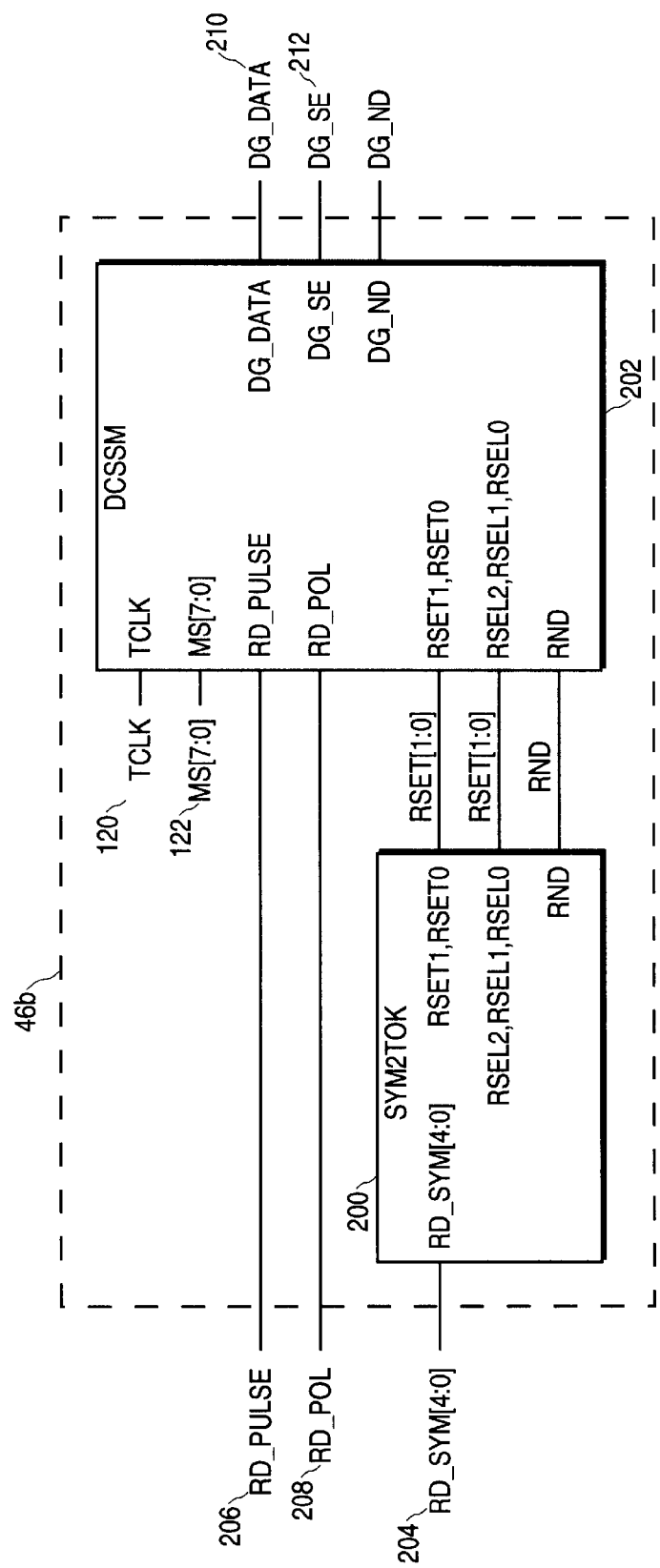

Referring again to FIG. 12 and to FIG. 13*b*, in response to the transmission of a sinusoidal pulse doublet from a transmitter 50*a* coupled the POTS wiring 14, a response waveform 150, such as that shown in FIG. 11, is received at a receiver 50*b*. In order to determine the time duration between transmitted pulses, the receiver 50*b* is required to determine the precise time of arrival of incident peaks, such as the incident peak 56 shown in FIG. 11. In one exemplary embodiment, the main receiver signal path consists of an amplifier followed by a differentiator (not shown). The amplifier may be necessary to compensate for the low transmit levels required for compliance with FCC Part 68, and gain is accordingly fixed at about 15 dB. The output of the amplifier is fed to a differentiator, whose output changes polarity whenever the input waveform's slope changes sign. Both time and amplitude processing circuits within the receiver 50*b* gate the output of the differentiator. Following the detection of a peak, a timer (which times the ISBI interval 94) is started. During this time the receiver 50*b* is disarmed. Peaks within the received waveform 150 are ignored during the ISBI interval, even if the amplitudes are greater than that of the originally detected peak.

The differentiator may be sensitive to noise and thus susceptible to producing spurious outputs during the ISBI period. In one exemplary embodiment, to further qualify the output of the differentiator, two comparators and a "peak following" threshold generating circuit (not shown) detect the polarity of an incoming pulse. The comparators take as inputs the amplified waveform and a threshold voltage. The comparators receive opposite phases of the amplified input waveform, so that one comparator's output is active when the waveform exceeds the threshold in a positive, direction, and the other comparator's output is active when the waveform exceeds the threshold in a negative direction. The threshold voltage, generated by the threshold generating circuit, tracks the amplitude of the incident peak 56. Once the incident peak 56 passes, the threshold voltage may be allowed to decay exponentially, as shown in FIG. 11, in a manner that roughly models the expected lowered amplitude response of received reflection pulses. A bias ensures that the threshold voltage can only sink to a minimum value representing the maximum sensitivity of the receiver 50*b*. A synchronized digital state machine controls operation of the receiver 50*b*. The receiver 50*b* is again armed when the amplified waveform voltage is below the threshold, and the ISBI timer has expired. As a new waveform 152 arrives, the amplified line voltage rises above, or falls below, the threshold voltage, causing one of the two comparators to again become active. This then sets a latch that remembers the polarity of the incident wave form, and disables the output of the other comparator until the receiver 50*b* is re-armed. The setting of this latch causes the threshold voltage to be driven to the peak voltage of the incident wave.

The latch also arms an edge detector circuit (not shown) which is looking for a transition from the peak detector, indicating the arrival of a first incident peak 56. The output of the edged detector is a one-cycle wide pulse synchronized to the system clock isolator. Detecting the peak starts the ISBI timer that, in turn, holds the comparator latch circuit reset and makes the receiver 50*b* blind to any more input pulses until the ISBI time expires.

While the receiver 50*b* is waiting of the next pulse, the threshold generating circuit output is in a high impedance state, allowing a capacitor to hold the threshold voltage. A bleed resistor causes this voltage to drain off, effectively increasing the sensitivity of the receiver 50*b* with the passing of time from the last pulse.

The decoder 46*b* performs the reverse of the operation performed by the encoder 46*a*. Specifically, the decoder 46*b* receives the encoding symbol portion 96 from the receiver 50*b* and reconstitutes a token (i.e. a set/select pair) from which the original bit sequence can be generated. Specifically, the decoder includes a symbol-to-token conversion circuit 200 and a decode state machine 202 as shown in FIG. 13*b*. The conversion circuit 200 receives the symbol via input RD_SYM[4:0] 204 from the receiver 50*b*, this symbol being derived from the measured inter-pulse time. Specifically, the receiver 50*b* identifies a composite symbol based on the time duration between succession delimiter pulses, and subtracts the known fixed-duration (or buffer portion) (ISBI) 94 from the composite symbol to reveal the encoding portion 96, which is represented by the signal on RD_SYM[4:0] input. The symbol is converted by the circuit 200 to the following token outputs:
1. RSET[1:0]: This output indicates the set of eight symbols to which the relevant symbol belongs; and
2. RSEL[2:0]: This output indicates which of the symbols in the selected set comprises the appropriate symbol.

The token values are then fed to the decode state machine 202 which, based on the supplied token consisting of a set, select and polarity, determines the length and pattern of the decoded bit sequence. The inputs to the decode state machine 202 include the following:
1. RD_PULSE 206: This signal indicates to the decode state machine 202 that a symbol pulse has been detected; and
2. RD_POL 208: This signal indicates the polarity bit of the pulse.

Outputs of the decode state machine 202 include the following:
1. DG_DATA 210: The decoded bit sequence is sent to the communications controller, via the GPSI 60, on this output; and
2. DG_SE 212: This output tells the GPSI 60 to shift in another bit.

While the above exemplary embodiment has been realized utilizing FPGAs, it will readily be appreciated that the circuitry and functional units described above may readily be incorporated within an Application Specific Integrated Circuit (ASIC).

Pulse Shape

Figure 14:
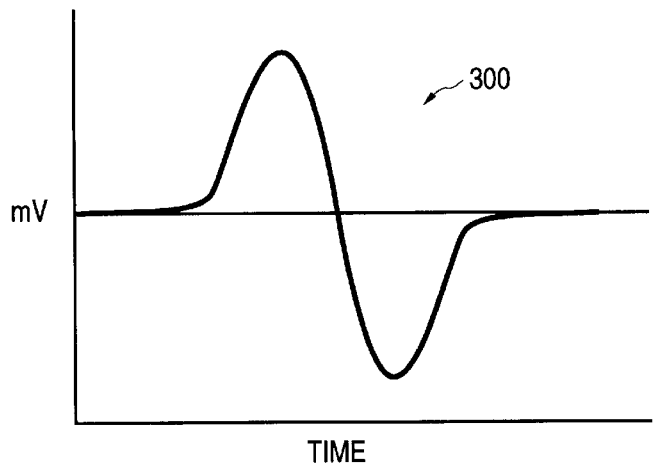
FIG. 14 is a diagrammatic representation of a symbol delimiter in the form of a pulse doublet.

In one embodiment of the present invention, the pulses included within the access identifier symbols 1066, and which comprises the delimiters of the data symbols 1068, may comprises pulse doublets, as discussed below and shown at 300 in FIG. 14. The pulse doublets 300 comprises two equal portions of equal duration and opposite polarity, so that no direct current (D.C.) component is generated on a wiring pair when the pulse doublet is transmitted thereon.

Figure 15:
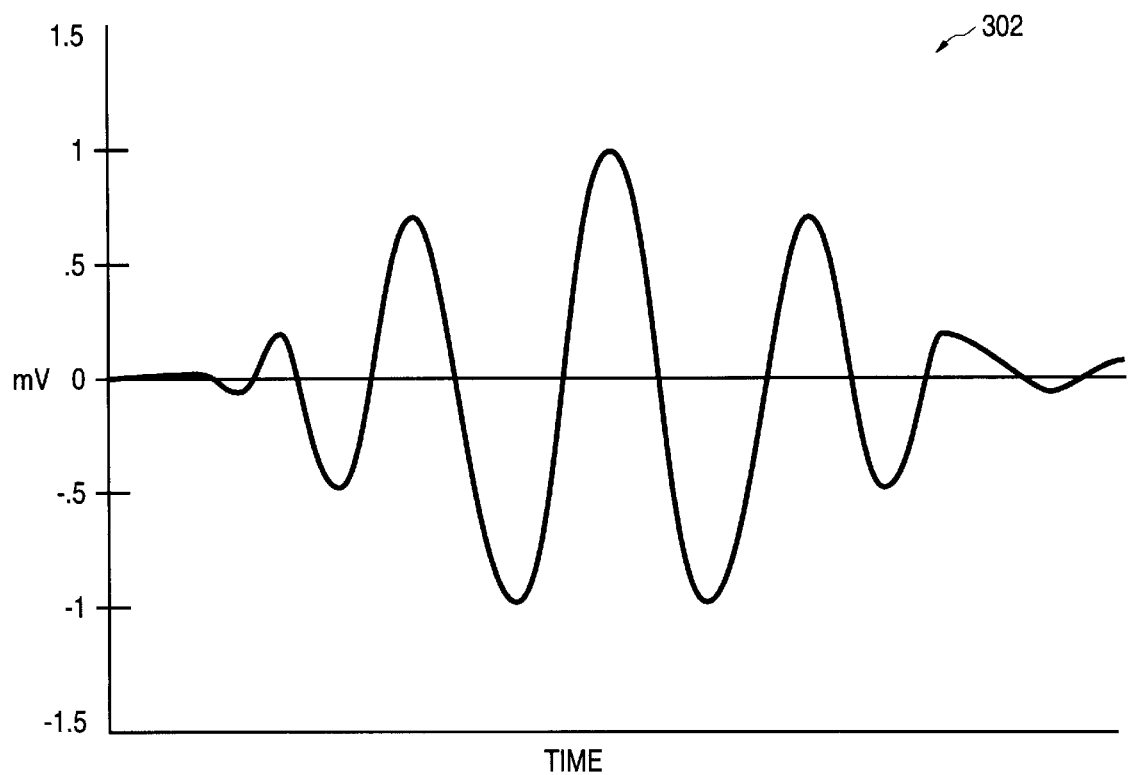
FIG. 15 is a diagrammatic representation of a symbol delimiter in the form of a multi-cycle waveform.
Figure 16:
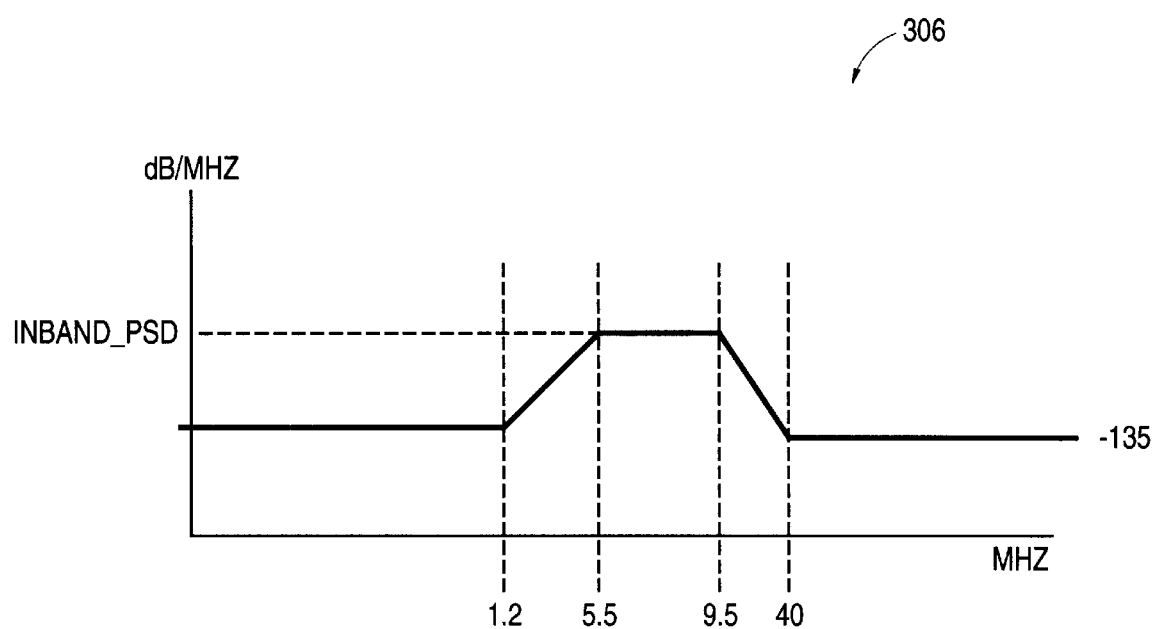
FIG. 16 is a diagrammatic representation of a spectral mask to which the output power spectrum of a transmitter, according to one embodiment of the present invention, may conform.

In an alternative embodiment of the present invention, the pulse may take the form illustrated in FIG. 15. Specifically, each pulse may comprise a multi-cycle waveform 302. The waveform 302 may be a 7.5 MHz waveform that is propagated from the transmitter 50A, and may include four cycles per pulse. In one embodiment the waveform 302 is formed from an integer number of cycles of a square wave having a frequency of 7.5 MHz that has been filtered using a bandpass filter, such as for example a five pole Butterworth filter having a passband of between 5.5 and 9.5 MHz. FIG. 16 illustrates a spectral mask 306 to which the output power spectrum of a transmitter 50a may conform. The power level requirements specified by the spectral mask below 1.1 MHz are to allow the modem 32 to interoperate with Analog Digital Subscriber Line (ADSL).

Alternative Embodiment

Figure 17:
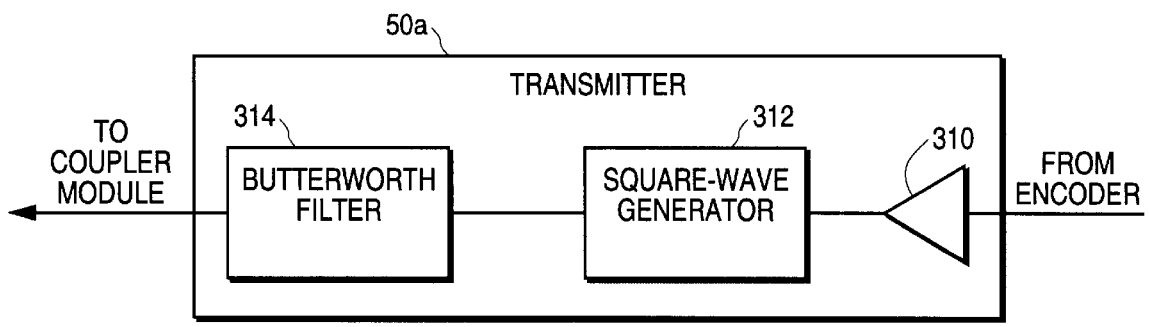
FIG. 17 is a block diagram illustrating selected components that may be included within a transmitter, according to one embodiment of the present invention, for the purpose of generating a multi-cycle waveform.

FIG. 17 is a block diagram illustrating selected components that may be included within a transmitter 50a for the purpose of generating the multi-cycle waveform 302 shown in FIG. 15. Specifically, an amplifier 310 receives encoded pulse signals, these signals being propagated through the amplifier 310 to a square-wave generator 312, which generates a four-cycle square wave having a frequency of 7.5 MHz. The four-cycle square wave is then propagated from the square-wave generator 312 through a Butterworth filter 314, which implements the spectral mask shown in FIG. 16, to generate the multi-cycle waveform 302.

Figure 18:
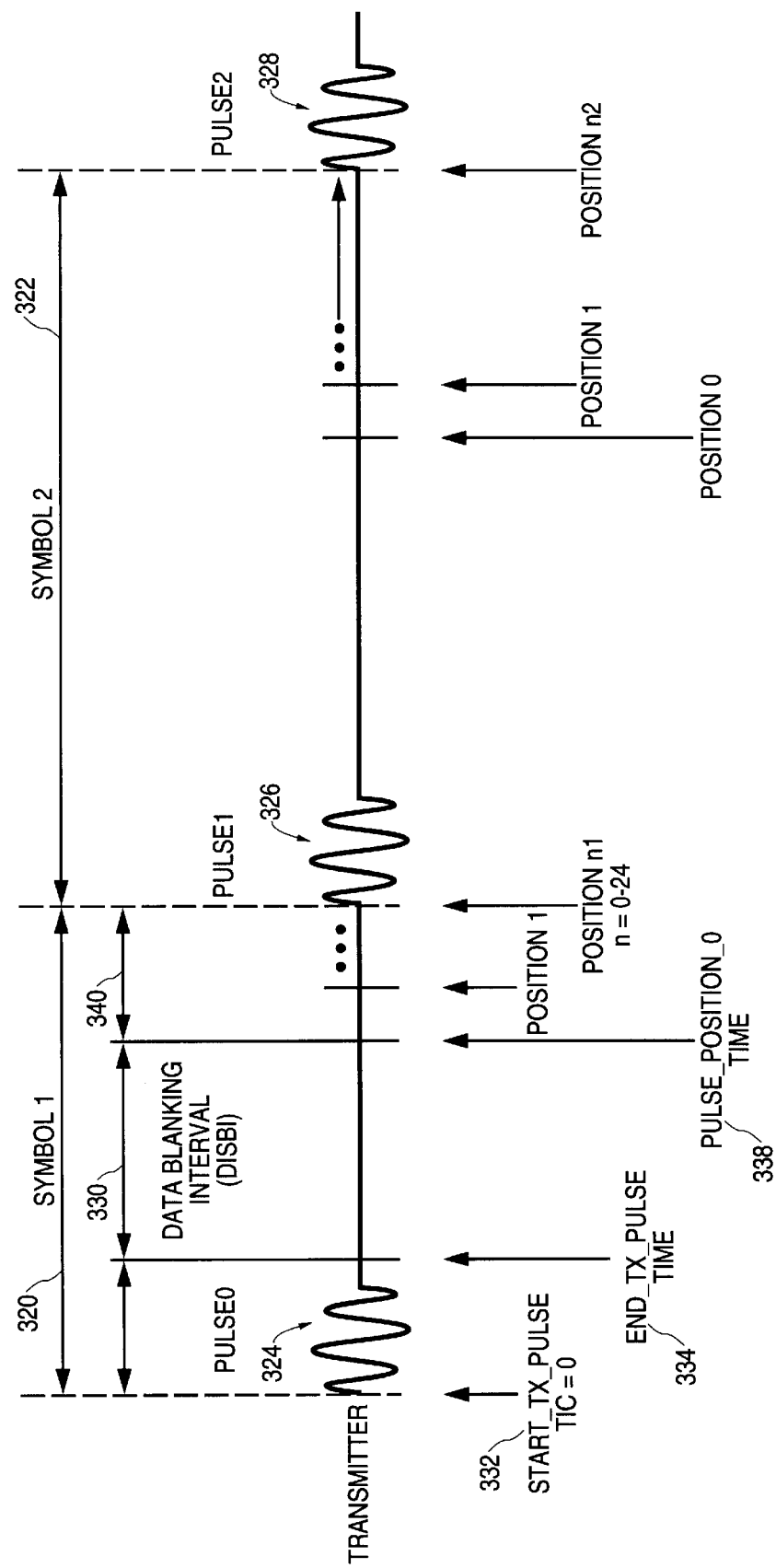
FIG. 18 is a representation of a sequence of symbols, each encoding a bit sequence, constructed according to one embodiment of the present invention within which the symbol delimiters comprise multi-cycle waveforms.

FIG. 18 illustrates a sequence of symbols, each encoding a bit sequence, constructed according to the alternative embodiment of the present invention wherein the delimiters of the symbols comprise multi-cycle waveforms. The transmission of two symbols 320 and 322 is illustrated, the symbols 320 and 322 being separated, distinguished and defined by the three consecutive pulses 324, 326 and 328 transmitted from the transmitter 50a over the wiring 14. As with the series of sequential symbols illustrated in FIG. 9, each symbol 320 and 322 has a predetermined duration as defined by the pulses, each duration being indicative of a respective bit sequence. A minimum time separates each of the pulses 324, 326 and 328 so as to allow reflections resulting from a preceding pulse to decay below a threshold of the receiver 50b, before the next pulse is propagated. This minimum time may conveniently be termed a Data Blanking Interval, and is illustrated at 330 for the symbol 320. The methodology of transmission of the symbols 320 and 322 is substantially the same as the methodology for the transmission of the symbols 90, as described above with reference to FIG. 9. However, the transmission of a symbol 320 commences with the transmission of a multi-cycle waveform pulse as indicated at 332, and the blanking interval 330 only begins after the transmission of the pulse has ended as indicated at 334. As also described above with reference to FIG. 9, each symbol, in addition to the fixed-duration blanking interval 330, also includes a variable-duration symbol portion 340. Depending on the length of the symbol portion 340 of an immediately preceding symbol, a subsequent pulse may begin at any one of twenty-four positions subsequent to the end position 338 of the blanking interval 330.

Figure 19:
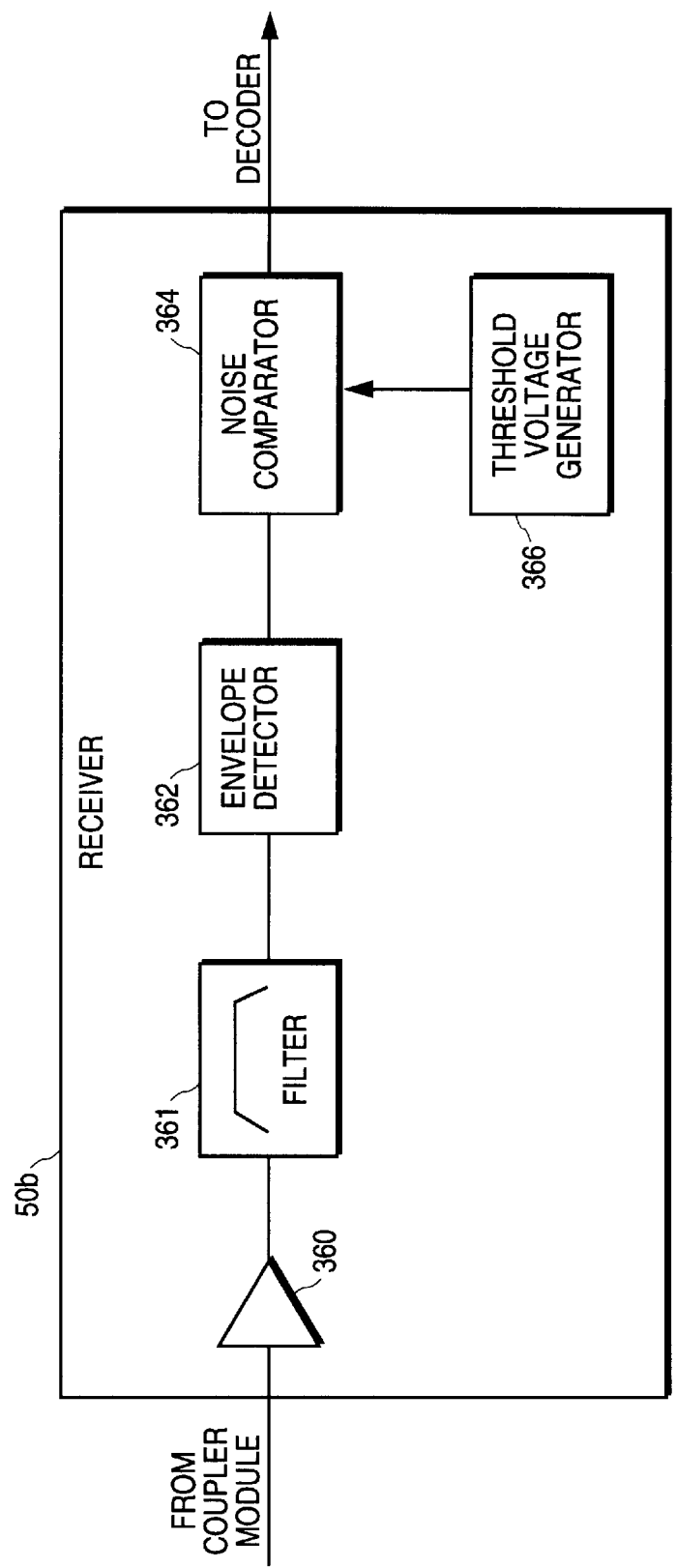
FIG. 19 is a block diagram of a receiver, according to one embodiment of the present invention.

FIG. 19 is a block diagram of an exemplary receiver 50b, according to the alternative embodiment of the present invention, showing selected components for use in the alternative embodiment of the present invention utilizing multi-cycle waveform pulses. The receiver 50b is shown to receive a signal from the wiring 14 via the coupler module (not shown) at an amplifier 360, from where the received signal is propagated to a filter 361 that limits the bandwidth of the received signal to between 5.5 and 9.5 MHz. The filtered signal is then propagated to an envelope detector 362. The output of the envelope detector 362 is an envelope waveform comprising a series of single pulses, which are propagated to a noise comparator 364, which in turn generates pulse signals to the decoder 46b. A threshold voltage generator 366 provides an input reference voltage to the noise comparator 364, so as to enable the noise comparator 364 to detect symbol delimiters in a precise manner. Specifically, the noise comparator 364 detects a transcendence of the reference voltage by the envelope signal as being a precise delimiter of a symbol.

In summary, the receiver 50b performs the following functions to decode a received waveform:
1. Rejects noise pulses.
2. Rejects decaying signal remnants of current or previous pulses.
3. Selects a distinctive feature of the waveform for timing measurement.
4. Accurately measures the time delay from the previous pulse.
5. Maximizes noise rejection during data symbol intervals.

By designing the electrical characteristics of the receiver 50b to bandlimit the incoming waveform to between 5.5 and 9.5 MHz, band noise and harmonic power may be effectively rejected. The detected signal may then effectively be "sliced" by the noise comparator 364. In order to reject noise impulses and the decaying remnants of a previous pulse, the threshold voltage generated by the threshold voltage generator 366 may be set at a level below that at which all pulses are ignored, but not at a level at which impulses and decaying remnants are detected. Accordingly, the threshold voltage should be set at a "sweet spot" at which only true pulses are detected upon transitioning the threshold voltage.

Figure 20:
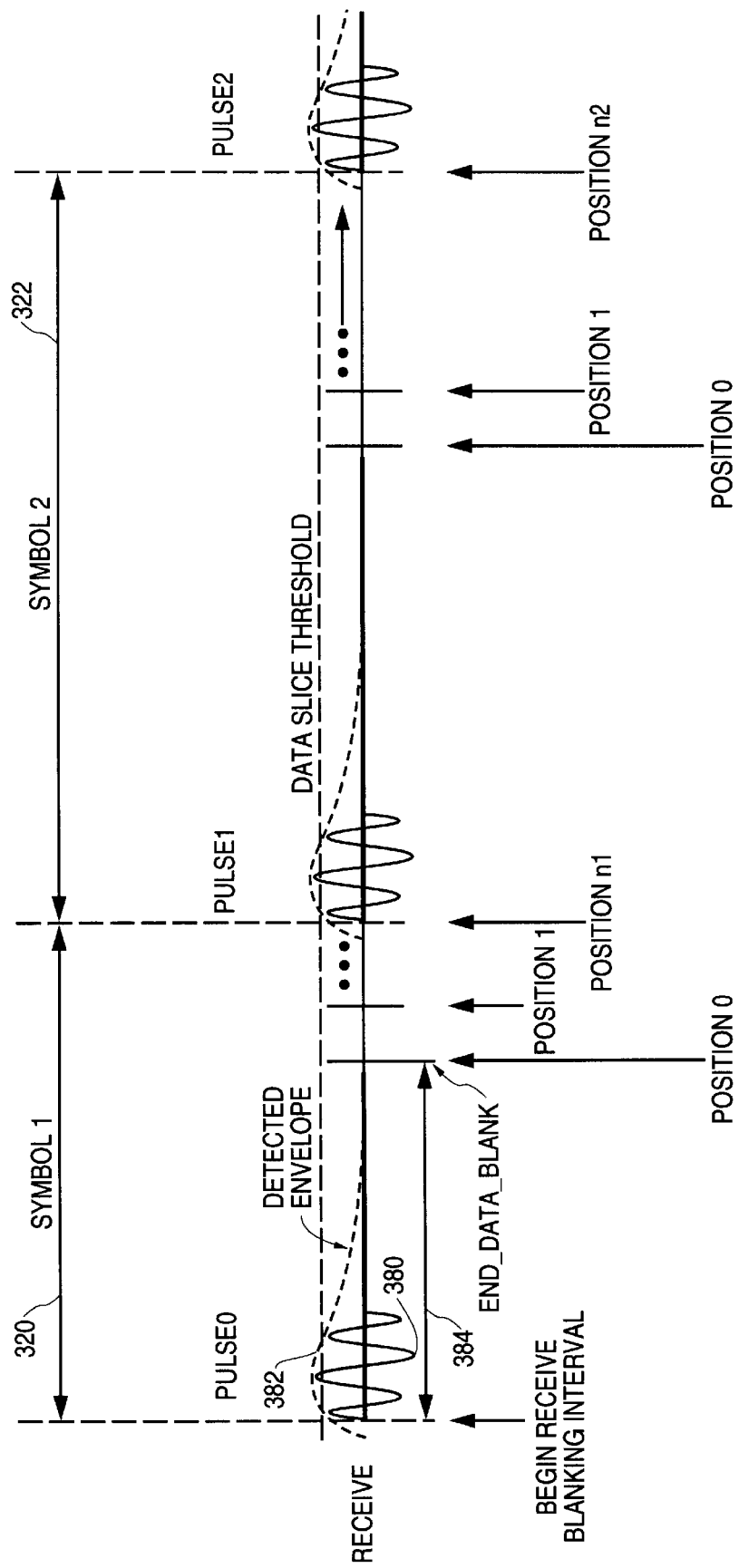
FIG. 20 is a representation of a waveform that may be received at a receiver, as a result of the propagation of a signal including multi-cycle waveform delimiters.

FIG. 20 is a diagram showing the waveform 380 that may be received at the receiver 50b as a result of the propagation of the signal illustrated in FIG. 18 over POTS wiring 14 within a structure. Specifically, symbols 320 and 322 are shown to be derived from the received signal. More specifically, the multi-cycle received waveform 380, as outputted from the filter 361, is fed to the envelope detector 362, which outputs an envelope signal 382. The noise comparator 364 detects points at which the envelope signal 382 signal level crosses the threshold voltage level of the threshold voltage outputted from the threshold voltage generator 366. The receiver 50b recognizes such a crossing as being a delimiting point of a symbol. Immediately after detecting such a threshold crossing, the receiver 50b disables any further detection for a predetermined blanking interval 384. Following the ending of the blanking interval 384, the receiver 50b is then re-enabled for pulse detection, and upon reception of a subsequent pulse (and the detection of an envelope signal threshold crossing), the elapsed time from the immediately preceding pulse is determined. This measured time is then utilized to identify one of a predetermined number of symbols in the manner described above.

Alternative Encoding Methodology

Figure 21:
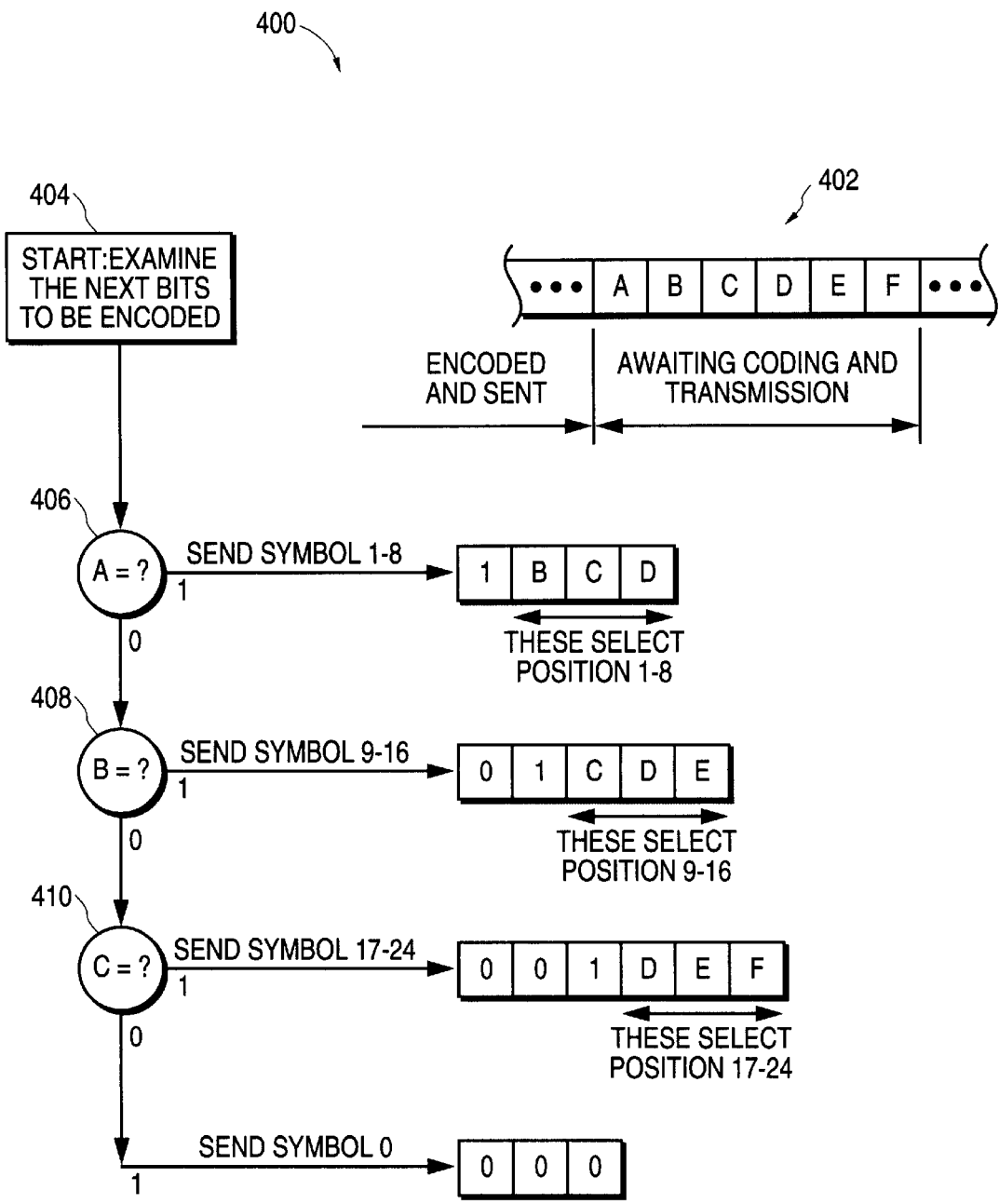
FIG. 21 is a diagrammatic representation of a coding tree, according to one embodiment of the present invention, for encoding a bit sequence.

FIG. 10 illustrates a coding tree wherein the polarity of a pulse doublet may be utilized to encode information. However, it will be appreciated that an alternative coding scheme will be required where the multi-cycle waveform is utilized, in view of the singular polarity of the pulse view in this embodiment. To this end, FIG. 21 illustrates an alternative coding tree 400 which details the encoding of data bits in groups of varying sizes, specifically 3, 4, 5 and 6 bits. Specifically, the coding tree 400 proposes a method by which pulse positions define symbols that encode predetermined sequences of bits. Furthermore, pulse positions are assigned to predetermined groups of bits such that the groups including a larger number of bits are encoded in symbols having a longer duration (that is the pulses are further apart) so that average and minimum bit rates are maintained at a predetermined level. An exemplary data stream from the MAC controller is shown at 402, and will be utilized to illustrate the logic embodied in the coding tree 400. The encoding process begins at the root node 404, and then proceeds to step 406, where a determination is made as to whether a first bit (bit A) is a logical one. If so, the immediately following three bits (bits B, C and D) select which of positions 1–8 (that is Symbols 1–8) is transmitted.

Alternatively, if the first bit is a zero, the coding tree 400 proceeds to step 408, where a determination is made as to whether the second bit (bits B) is a logical one. If so, then the next three bits (bits B, D and C) select one of positions 9–16 (that is Symbols 9–16) to be transmitted. If the first and second bits are both logical zeros, the coding tree 400 proceeds from step 408 to step 410, where a determination is made as to whether the third bit (bit C) is a logical one.

If so, then the next three bits (bits D, E and F) select which of positions 17–24 (that is Symbols 17–24) is transmitted. Finally, if the first three bits are all the zeros, the position 0 (that is the Symbol 0) is transmitted.

In summary, the Symbol 0 encodes the three-bit Data Pattern 0.0.0; Symbols 1–8 encoded the four-bit Data Pattern 1.B.C.D., Symbols 9–16 encoded the five-bit Data Pattern 0.1.C.D.E., and Symbols 17–24 encode the six-bit Data Pattern 0.0.1.D.E.F. If the data encoded is random, approximately 50 percent of the symbols will encode four-bit patterns, 25 percent of the symbols transmitted will encode five-bit patterns, 12.5 percent of the transmitted symbols will encode six-bit patterns, and 12.5 percent of the transmitted symbols will encode three-bit patterns.

Thus, a method and apparatus for encoding and decoding a bit sequence for transmission over a POTS wiring have been described. Although the present invention has been described with reference to specific exemplary embodiments, it will be evident that various modifications and changes may be made to these embodiments without departing from the broader scope and spirit of the invention. Accordingly, the specification and drawings are to be regarded in an illustrative rather than a restrictive sense.

What is claimed is:

1. A method of transmitting information over a carrier medium within a computer network, the method including:
   selecting a time symbol from a group of time symbols, each time symbol within the group of time symbols representing predetermined information;
   propagating a first delimiter signal over the carrier medium at a first time; and
   propagating a second delimiter signal over the carrier medium at a second time, the time duration between the propagation of the first and second delimiter signals defining the selected time symbol, and the first and second delimiter signals each comprising a multi-cycle waveform having a frequency of greater than 1.1 MHz.

2. The method of claim 1 including propagating each of the first and second delimiter signals as a multi-cycle waveform having a frequency of between 5.5 and 9.5 MHz.

3. The method of claim 2 including propagating each of the first and second delimiter signals as a multi-cycle waveform having a frequency of approximately 7.5 MHz.

4. The method of claim 1 including propagating each of the first and second delimiter signals as a four-cycle waveform.

5. The method of claim 1 wherein the propagating of the first and second delimiter signals each include propagating a multi-cycle square wave through a filter.

6. The method of claim 5 including propagating the multi-cycle square waveform through a Butterworth filter.

7. The method of claim 1 wherein each time symbol within the group of time symbols comprises a fixed-duration portion and a respective encoding portion.

8. The method of claim 1 including the step of propagating the second delimiter signal so that the time duration between the propagation of the first and second delimiter signals is such that reflections on the carrier medium resulting from the propagation of the final delimiter signal have decayed to a predetermined level prior to propagation of the second delimiter signal.

9. The method of claim 8 wherein the propagating of the first and second delimiter signals each comprise propagating a respective delimiter signal over POTS wiring within a structure from a transmitter to a receiver.

10. The method of claim 8 wherein the propagating of the first and second delimiter signals each comprise propagating a respective delimiter signal over UTP wiring within a structure from a transmitter to a receiver.

11. The method of claim 9 wherein the maximum distance between the transmitter and the receiver is less than 500 feet.

12. Apparatus for transmitting information over a carrier medium within a computer network, the apparatus including:

an output to couple the apparatus to the carrier medium; and an encoder to select a time symbol from a group of time symbols, each time symbol within the group of time symbols representing predetermined information;

a transmitter, coupled to the encoder, to propagate first and second delimiter signals at first and second times, the time duration between the propagation of the first and second delimiter signals defining the selected time symbol, and to construct each of the first and second delimiter signals as a multi-cycle waveform having a frequency of greater than 1.1 MHz.

13. The apparatus of claim 12 wherein the transmitter constructs each of the first and second delimiter signals as a multi-cycle waveform having a frequency of between 5.5 and 9.5 MHz.

14. The apparatus of claim 13 wherein the transmitter constructs each of the first and second delimiter signals as a multi-cycle waveform having a frequency of approximately 7.5 MHz.

15. The apparatus of claim 12 wherein the transmitter constructs each of the first and second delimiter signals as a four-cycle waveform.

16. The apparatus of claim 12 wherein the transmitter includes a filter through a multi-cycle square wave is propagated to generate the first and second delimiter signals.

17. The apparatus of claim 16 wherein the filter is a Butterworth filter.

18. The apparatus of claim 12 wherein each time symbol within the group of time symbols comprises a fixed-duration portion and a respective encoding portion.

19. The apparatus of claim 12 wherein the transmitter propagates the second delimiter signal so that the time duration between the propagation of the first and second delimiter signals is such that reflections on the carrier medium resulting from the propagation of the first delimiter signal have decayed to a predetermined level prior to the propagation of the second delimiter signal.

20. The apparatus of claim 12 wherein the carrier medium comprises POTS wiring within a structure coupled between a transmitter and a receiver.

21. The apparatus of claim 12 wherein the carrier medium comprises UTP wiring within a structure coupled between a transmitter and a receiver.

22. The apparatus of claim 20 wherein the maximum distance between the transmitter and the receiver is less than 500 feet.

* * * * *